US011515962B2

(12) United States Patent
Zhou et al.

(10) Patent No.: US 11,515,962 B2
(45) Date of Patent: Nov. 29, 2022

(54) NETWORK CODING BASED ON FEEDBACK

(71) Applicant: QUALCOMM Incorporated, San Diego, CA (US)

(72) Inventors: Shanyu Zhou, San Diego, CA (US); Jelena Damnjanovic, Del Mar, CA (US); Tao Luo, San Diego, CA (US); Sony Akkarakaran, Poway, CA (US); Jingchao Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/301,707

(22) Filed: Apr. 12, 2021

(65) Prior Publication Data

US 2021/0328711 A1    Oct. 21, 2021

Related U.S. Application Data

(60) Provisional application No. 63/011,267, filed on Apr. 16, 2020.

(51) Int. Cl.
*H04L 1/00* (2006.01)
*H03M 13/15* (2006.01)

(52) U.S. Cl.
CPC ........ *H04L 1/0013* (2013.01); *H03M 13/154* (2013.01); *H04L 1/0033* (2013.01)

(58) Field of Classification Search
CPC ... H04L 1/0013; H04L 1/0033; H04L 1/0076; H04L 1/0009; H04L 1/1607; H03M 13/154; H03M 13/35; H03M 13/353
See application file for complete search history.

(56) References Cited

U.S. PATENT DOCUMENTS

| 8,826,102 B2* | 9/2014 | Liu ....................... H03M 13/35 |
| | | 714/776 |
| 8,873,671 B2* | 10/2014 | Sampath ............... H04L 1/1835 |
| | | 375/295 |
| 2002/0018446 A1* | 2/2002 | Huh ...................... H04L 1/1877 |
| | | 370/347 |

(Continued)

FOREIGN PATENT DOCUMENTS

| EP | 3188391 A1 | 7/2017 |
| WO | 2017095282 A1 | 6/2017 |

OTHER PUBLICATIONS

International Search Report and Written Opinion—PCT/US2021/027141—ISA/EPO—dated Jul. 21, 2021.

*Primary Examiner* — Thien Nguyen
(74) *Attorney, Agent, or Firm* — ArentFox Schiff LLP

(57) ABSTRACT

A transmitter may be configured to determine a coding rate at which to encode data packets based on a quantity of encoded packets used by a receiver for recovery of one data packet. The transmitter may be further configured to transmit a set of encoded packets generated at the coding rate to the receiver. The receiver may be configured to receive, from the transmitter, encoded packets carrying a set of data packets encoded at a coding rate. The receiver may be further configured to transmit, to the transmitter, feedback indicating a quantity of a set of the encoded packets used for recovery of one data packet of the set of data packets. The receiver may be further configured to receive, from the transmitter, other encoded packets carrying another set of data packets encoded at another coding rate.

29 Claims, 15 Drawing Sheets

(56) References Cited

U.S. PATENT DOCUMENTS

| | | | |
|---|---|---|---|
| 2003/0231706 A1* | 12/2003 | Hwang | H04L 1/0003 375/219 |
| 2008/0123579 A1* | 5/2008 | Kozat | H04L 1/1887 370/312 |
| 2009/0067424 A1* | 3/2009 | Zhang | H04L 1/1819 370/389 |
| 2009/0067543 A1* | 3/2009 | Hsiao | H04L 1/0067 375/295 |
| 2009/0161641 A1* | 6/2009 | Kim | H04L 1/0003 375/267 |
| 2012/0127921 A1* | 5/2012 | Laufer | H04L 1/0009 455/10 |
| 2012/0320858 A1* | 12/2012 | Maru | H04L 1/0003 370/329 |
| 2014/0075260 A1* | 3/2014 | Murakami | H04L 1/1825 714/751 |
| 2015/0109933 A1* | 4/2015 | Song | H04L 45/24 370/238 |
| 2016/0028416 A1* | 1/2016 | Luby | H03M 13/3761 714/779 |
| 2016/0150524 A1* | 5/2016 | Ram | H04W 72/08 370/329 |
| 2016/0241615 A1* | 8/2016 | Chen | H04L 41/5009 |
| 2016/0285944 A1* | 9/2016 | Parikh | H04L 65/762 |
| 2017/0012687 A1* | 1/2017 | Sawahashi | H04B 7/0667 |
| 2017/0118673 A1* | 4/2017 | Narasimha | H04L 1/1671 |
| 2017/0149524 A1* | 5/2017 | Murakami | H03M 13/6393 |
| 2017/0188203 A1* | 6/2017 | Goseling | H04W 4/06 |
| 2018/0146423 A1* | 5/2018 | Ponnuswamy | H04W 72/005 |
| 2018/0324007 A1* | 11/2018 | Nammi | H04B 7/0626 |
| 2018/0331781 A1* | 11/2018 | Welin | H04L 43/0888 |
| 2019/0036585 A1* | 1/2019 | Hosseini | H04B 7/0639 |
| 2019/0158129 A1* | 5/2019 | Murakami | H03M 13/3723 |
| 2019/0190542 A1* | 6/2019 | Wang | H04L 1/0057 |
| 2020/0007247 A1* | 1/2020 | Gulati | H04B 7/0634 |
| 2020/0028657 A1* | 1/2020 | Bharadwaj | H04B 7/063 |
| 2020/0136759 A1* | 4/2020 | Murakami | H04L 1/0057 |
| 2020/0252160 A1* | 8/2020 | Ho | H04L 47/27 |

* cited by examiner

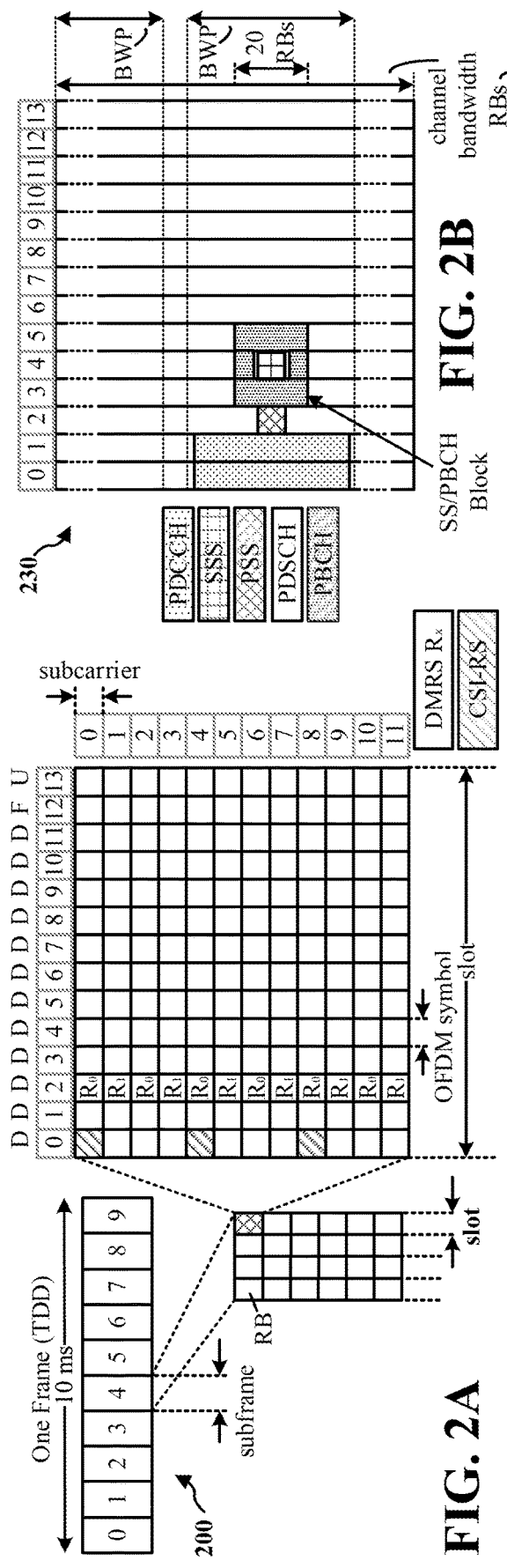
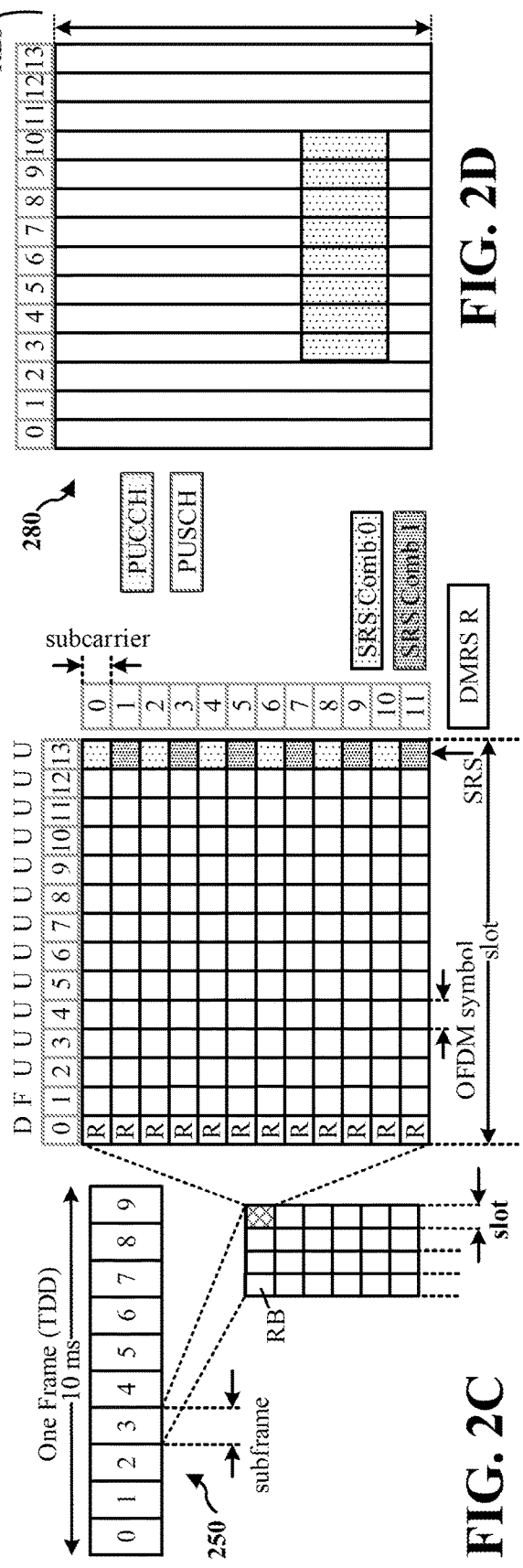
FIG. 2A
FIG. 2B
FIG. 2C
FIG. 2D

NETWORK CODING BASED ON FEEDBACK

CROSS REFERENCE TO RELATED APPLICATION(S)

This application claims the benefit of U.S. Provisional Application Ser. No. 63/011,267, entitled "NETWORK CODING UPDATE USING DECODED PACKETS FEEDBACK" and filed on Apr. 16, 2020, the disclosure of which is expressly incorporated by reference herein in its entirety.

BACKGROUND

Technical Field

The present disclosure generally relates to communication systems, and more particularly, to a transmitter configured to encode packets for transmission based on feedback from a receiver configured to generate the feedback based on decoding encoded packets.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Channels on which devices communicate in a network are often less than ideal. For example, wireless channel environments frequently include interference, blockages, noise, or other elements tending to degrade signal transmission. Therefore, some data loss is likely to occur during transmission. Network coding (NC) provides a mechanism for reducing data loss. With NC, data is divided into subunits and redundantly encoded by a transmitter at a coding rate. The encoded data transmitted to a receiver, which may be able to recover the original data from the encoded data.

As conditions on wireless channels are inherently random, different coding rates may be more suitable for different wireless channels. However, as channel conditions are time variant, and potentially on a sub-second or even sub-millisecond scale, one coding rate may not necessarily be suitable during one data stream. The present disclosure provides some techniques and solutions to some instances in which channel conditions may change during data transmission.

In an aspect of the disclosure, a method, a computer-readable medium, and an apparatus are provided. The apparatus may be a transmitter on a link for NC communication with a receiver. The apparatus may be configured to determine a coding rate at which to encode data packets based on a quantity of encoded packets used by a receiver for recovery of one data packet. The apparatus may be further configured to transmit a set of encoded packets generated at the coding rate to the receiver.

In another aspect of the disclosure, another method, another computer-readable medium, and another apparatus are provided. The apparatus may be a receiver on a link for NC communication with a transmitter. The apparatus may be configured to receive, from a transmitter, encoded packets carrying a set of data packets encoded at a coding rate. The apparatus may be further configured to transmit, to the transmitter, feedback indicating a quantity of a set of the encoded packets used for recovery of one data packet of the set of data packets. The apparatus may be further configured to receive, from the transmitter, other encoded packets carrying another set of data packets encoded at another coding rate.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 2A is a diagram illustrating an example of a first frame, in accordance with various aspects of the present disclosure.

FIG. 2B is a diagram illustrating an example of downlink channels within a subframe, in accordance with various aspects of the present disclosure.

FIG. 2C is a diagram illustrating an example of a second frame, in accordance with various aspects of the present disclosure.

FIG. 2D is a diagram illustrating an example of uplink channels within a subframe, in accordance with various aspects of the present disclosure.

DETAILED DESCRIPTION

Figure 1:
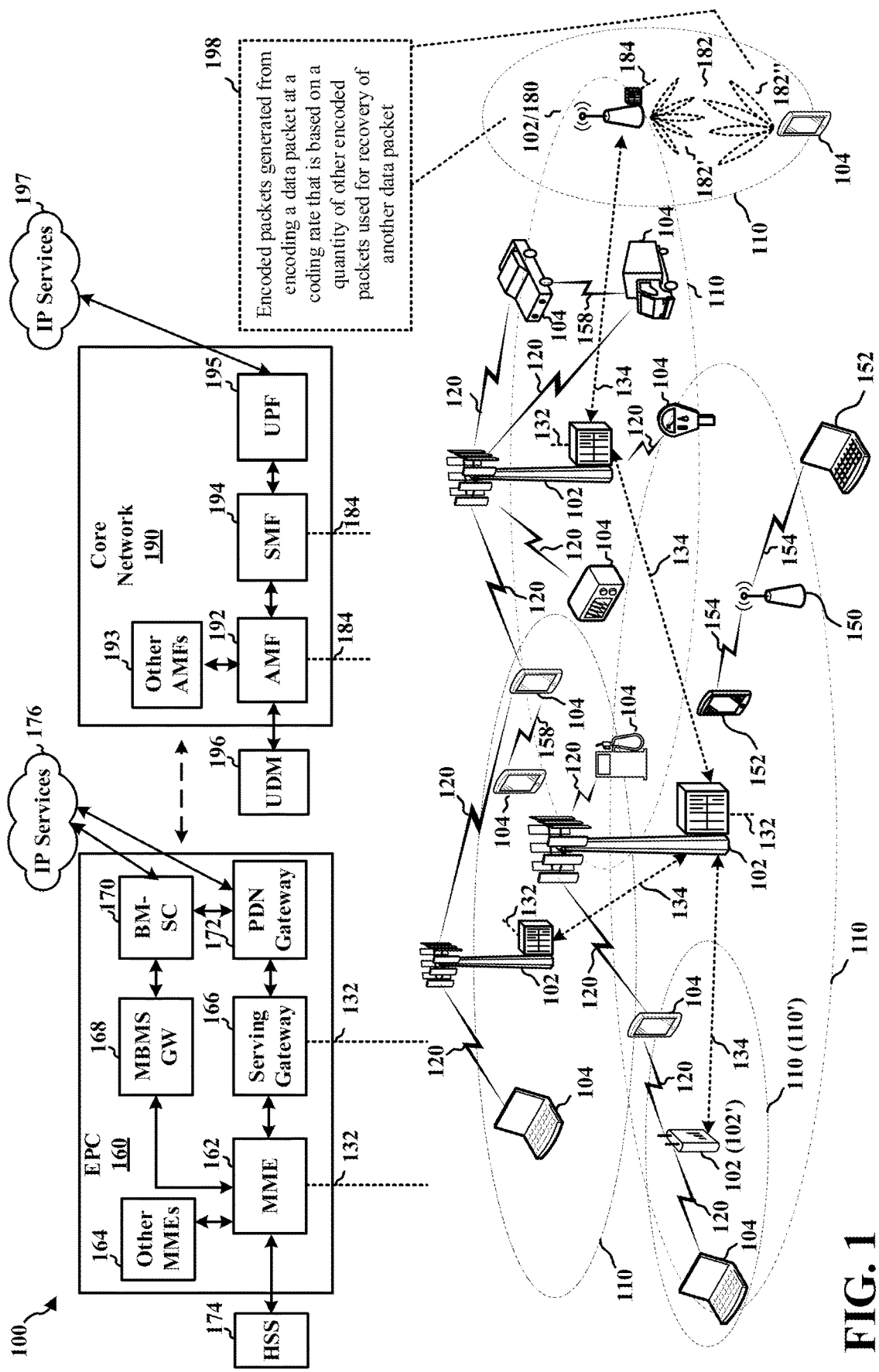
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, computer-executable code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or computer-executable code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer-executable code in the form of instructions or data structures that can be accessed by a computer.

In general, the channels on which devices communicate in a network are not ideal channels, and particularly in wireless networking applications. Therefore, some data loss is likely to occur during transmission. Network coding (NC) provides a mechanism for reducing data loss. With NC, data is divided into subunits and redundantly encoded by a transmit (TX) side. For example, one original packet may be divided into subpackets and encoded into a number N of encoded packets according to a coding rate. The probability of a receive (RX) side receiving the data may be increased, as the redundant information in the N encoded packets may provide the receiver with more opportunities to recover the data, for example, when the encoded packets are received with bit erasures.

However, the inherently random nature of wireless environments may result in variations between the number N of encoded packets transmitted by the TX side for data recovery and another number M of encoded packets that the RX side actually uses to recover that data. When the RX side uses fewer encoded packets to recover data than the TX side transmits for that data (e.g., when N is greater than M), overhead may be increased at both the TX side and the RX side, or on the network, due to the inefficient use of network resources for redundant information that goes unused, which may increase network load, congestion, processor capacity, or otherwise increase latency. The corollary being that the RX side is unable to recover some data that is lost during transmission when the TX side does not transmit an amount of encoded packets that is sufficient for the RX side to recover from data loss (e.g., when Nis less than a theoretical M).

As the inherent randomness of wireless channels is time variant, the code rate at which data is encoded upon establishing a link or initiating a transmission may become undesirable for encoding data at another time. Therefore, the RX side may provide some feedback acknowledging received packets to the TX side. Such feedback, however, may acknowledge that some encoded packets have been received by the RX side. Before decoding, however, the RX side may be unaware of whether some data has been lost; rather, the RX side may acknowledge that some encoded packets have been received but may not necessarily acknowledge whether those encoded packets contain enough redundancy to recover data that is missing or lost (e.g., bit erasures).

In some situations, such as the aforementioned in which successful reception of some encoded packets is acknowledged by the RX side but feedback related to data recovery after encoded packet reception is insufficient or absent, the TX side may maintain a coding rate at which to encode data that is insufficient for the RX side to actually recover the data, even if the RX side is able to receive encoded packets on the channel. In other situations, such as those in which the data is encoded with more redundancy than is actually used in data recovery, the TX side may maintain a coding rate at which to encode data that is inefficient for the channel conditions on which the encoded packets are transmitted.

In view of the foregoing, there exists a need to address instances of NC in which the coding rate is unsuitable for the channel conditions on which encoded packets are transmitted, either because data is encoded with insufficient redundancy to allow the RX side to recover the data or because data is encoded with superfluous redundancy that goes unused at the RX side but remains as expensive as any other equivalent signaling in terms of network or device overhead.

The present disclosure provides various techniques and solutions to instances of NC in which a coding rate set by a TX side is unsuitable for the channel on which to communicate with an RX side. In particular, aspects described herein provide for adaption of a coding rate with which to encode data for transmission. Some examples of the various techniques and solutions of the present disclosure provide for dynamic adaption of a coding rate during packet transmission, e.g., so that the coding rate is able to be adapted midstream for time-variant channel conditions that cause some packets of a stream to experience a different environment than other packets of the stream.

Some aspects of the present disclosure describe a coding rate at which to encode data is adapted based on a quantity of encoded packets that an RX side uses to recover some data. Some such aspects may be applied so that the coding rate may be suitable for the RX side to recover data while simultaneously reducing or avoiding extraneous redundancy that would otherwise negatively impact network or device performance.

While various aspects are herein described in the context of wireless networks using rateless NC (that is, fountain codes or other erasure codes without fixed coding rates), the concepts and aspects provided herein may be applied in other wired or wireless networks or other data protection methods without departing from the scope of the present disclosure. For example, the present disclosure describes some aspects in the context of a radio access technology (RAT), and specifically 5G New Radio (NR) and Long Term Evolution (LTE); however, the concepts and various aspects described herein may be applicable to other similar areas, such as Wi-Fi, Bluetooth, LTE-Advanced (LTE-A), Code Division Multiple Access (CDMA), Global System for Mobile communications (GSM), or other wireless/radio access technologies.

FIG. 1 is a diagram illustrating an example of a wireless communications system and an access network 100. The wireless communications system (also referred to as a wireless wide area network (WWAN)) includes base stations 102, user equipment(s) (UE) 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., 51 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, Multimedia Broadcast Multicast Service (MBMS), subscriber and equipment trace, RAN information management (RIM), paging, positioning, and delivery of warning messages.

The some aspects, the base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless. At least some of the base stations 102 may be configured for integrated access and backhaul (JAB). Accordingly, such base stations may wirelessly communicate with other such base stations. For example, at least some of the base stations 102 configured for JAB may have a split architecture that includes at least one of a central unit (CU), a distributed unit (DU), a radio unit (RU), a remote radio head (RRH), and/or a remote unit, some or all of which may be collocated or distributed and/or may communicate with one another. In some configurations of such a split architecture, the CU may implement some or all functionality of a radio resource control (RRC) layer, whereas the DU may implement some or all of the functionality of an radio link control (RLC) layer.

Illustratively, some of the base stations 102 configured for JAB may communicate through a respective CU with a DU of a parent and, further, may communicate through a respective DU with child IAB nodes (e.g., other base stations) and/or one or more of the UEs 104. One or more of the base stations 102 configured for IAB may be an IAB donor connected through a CU with at least one of the EPC 160 and/or the core network 190. In so doing, the base station(s) 102 operating as an JAB donor(s) may provide a link to the one of the EPC 160 and/or the core network 190 for other JAB nodes, which may be directly or indirectly (e.g., separated from an IAB donor by more than one hop) and/or one or more of the UEs 104, both of which may have communicate with a DU(s) of the JAB donor(s). In some additional aspects, one or more of the base stations 102 may be configured with connectivity in an open RAN (ORAN) and/or a virtualized RAN (VRAN), which may be enabled through at least one respective CU, DU, RU, RRH, and/or remote unit.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (also referred to as reverse link) transmissions from a UE 104 to a base station 102 and/or downlink (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y megahertz (MHz) (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to downlink and uplink (e.g., more or fewer carriers may be allocated for downlink than for uplink). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the downlink/uplink WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 gigahertz (GHz) unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, an MBMS Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a Packet Switch (PS) Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides Quality of Service (QoS) flow and session management. All user IP packets are transferred through the UPF 195. The UPF 195 provides UE IP address allocation as well as other functions. The UPF 195 is connected to the IP Services 197. The IP Services 197 may include the Internet, an intranet, an IMS, a PS Streaming Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 and/or the base station 102/180 may be configured to encode and/or decode data packets with NC. By way of illustration and not limitation, the base station 102/180 may operate as the transmitting side of a link established with the UE 104, as the base station 102/180 may be transmitting data to the UE 104. Correspondingly, the UE 104 may operate as the receiving side of the link, as the UE 104 may be receiving data from the base station 102/180. Further, the UE 104 may transmit feedback to the base station 102/180 based on the data transmitted by the base station 102/180.

The various concepts and aspects described herein are not limited to a base station operating as the transmitter and/or a UE operating as the receiver. In some examples, a UE may operate as the transmitter and a base station may operate as the receiver. In some other examples, a UE may operate as the transmitter and another UE may operate as the receiver, such as with D2D communication. In still other examples, a base station may operate as the transmitter and another base station may operate as the receiver, such as with IAB.

At a transmitting side of a link, NC may involve encoding a set of data packets (also referred to as "native" packets or "original" packets) into a set of encoded packets. At a receiving side of a link, NC may involve decoding a set of encoded packets to recover a set data packets. However, encoding data packets into encoded packets may not necessarily result in a one-to-one relationship between the uncoded data packets and the encoded packets. Rather, data packets may be encoded into encoded packets at a coding rate, which may define a ratio of data packets to encoded packets. The coding rate may be adaptable by the transmitter, e.g., according to one or more time-variant conditions, some of which may not be known a priori by the transmitter. By adapting the coding rate, decoding failures (e.g., due to erasures and/or errors) at a receiver may be reduced and extraneous signaling may be reduced or avoided, and so communication between the transmitter and the receiver may be improved and interference on resources caused by the transmitter may be reduced.

According to various aspects of the present disclosure, the base station 102/180, configured as a transmitter, may encode data packets into encoded packets at a coding rate, which may specify the number of encoded packets into which each of the data packets is encoded. For example, the base station 102/180 may encode the data packets into the encoded packets with an NC encoder or other component having an algorithm that uses a fountain code, which may be rateless (e.g., the coding rate may not be fixed), such as a Raptor code or Luby transform (LT) code.

In some aspects, the base station 102/180 may encode a data packet into a set of encoded packets such that the data packet can be recovered from a subset of the encoded packets. Potentially, however, the subset of encoded packets may be at least equal to the size of the data packet, or the subset of encoded packets may carry at least the same amount of information as the data packet—e.g., the subset of encoded packets may be equal in size to, or may carry the same information as, the data packet if no or few erasures (e.g., a number of erasures not exceeding that which the receiver is capable of recovering) occur when received.

The base station 102/180 may then transmit the encoded packets to the UE 104. Configured as a receiver, the UE 104 may receive the encoded packets, and may decode at least a portion of the received encoded packets using an NC decoder configured with a decoding algorithm that corresponds to the NC encoder algorithm implemented by the base station 102/180. For example, the UE 104 may include an NC decoder or other component that is configured with functionality configured to reverse the fountain code used to encode the data packets by the base station 102/180. That is, the UE 104 may recover a data packet from one or more of the encoded packets generated from encoding the data packets by the base station.

If the UE 104 is able to successfully recover the data packet, such as when the UE 104 determines that the recovered data packet passes a data integrity check, then the UE 104 may indicate, in the feedback, that recovery of the original data packet has successfully completed. However, if the UE 104 is unable to successfully recover the data packet, such as when the UE 104 detects a decoding failure, receives an number of encoded packets that is insufficient for erasure correction, and/or determines that the recovered data packet fails a data integrity check, then the UE 104 may indicate, in the feedback, that recovery of the original data packet has unsuccessfully completed.

Feedback transmitted by the UE 104 may further indicate the quantity of encoded packets used by the UE 104 to recover (or attempt to recover) the original data packet. In some aspects, the UE 104 may explicitly indicate the quantity of encoded packets used in recovery of the original data packet. For example, the UE 104 may indicate the quantity of encoded packets used for recovery of the data packet in a status report corresponding to Layer 2 (L2) of a protocol stack.

In some other aspects, the UE 104 may implicitly indicate the quantity of encoded packets using in recovery of the data packet. For example, the UE 104 may transmit acknowledgement (ACK) and/or non- or negative-ACK (HACK) feedback in association with receiving the encoded packets, e.g., such as ACK/NACK feedback for at least one ARQ or hybrid-ARQ (HARQ) procedure or process configured at L2. The quantity of encoded packets used by the UE 104 to recover the data packet may be implicitly indicated by the quantity of encoded packets that are acknowledged (e.g., by a corresponding ACK) by the UE 104 between completion of recovery of the immediately preceding data packet and completion of recovery of the immediately succeeding data packet. However, the UE 104 may be largely or entirely agnostic to or unaware of the determination at the base station 102/180 of the quantity of encoded packets used in recovery of a data packet by the UE 104. Rather, the base station 102/180 may derive the quantity of encoded packets used in recovery of a data packet from feedback received from the UE 104, as the feedback may serve as an implicit indication of such a quantity.

The base station 102/180 may receive, from the UE 104, the feedback that explicitly or implicitly indicates the quantity of encoded packets used by the receiver in recovery of the data packet, and according to the feedback, may determine the quantity. Based on the quantity of encoded packets used for recovery of one data packet by the UE 104 and/or whether the recovery of the one data packet succeeded or failed, the base station 102/180 may determine the coding rate at which to encode data packets.

The coding rate determined by the base station 102/180 may result in the quantity of encoded packets generated by encoding a data packet to be increased, decreased, or remain unchanged. For example, the coding rate may balance some competing interests commensurate with communication on a wireless channel having finite resources, such as the need for redundancy to correct erasures balanced with the need to mitigate or avoid signaling beyond the minimal amount necessary for recovery of data received on the wireless channel, such as signaling beyond a minimal amount may that acts as interference on the channel to other devices. Additionally or alternatively, signaling beyond that enabling the receiver to recover data received on the wireless channel may introduce some overhead in terms of latency, consumption of computational resources (e.g., memory, processing power or capacity, etc.), and the like, for example, because the effects of generating, encoding, transmitting, and/or other operation(s) performed by the transmitter and receiving, decoding, acknowledging, and/or other operation(s) performed by the receiver may each add to latency or other overhead to some extent.

Illustratively, the base station 102/180 may adjust the coding rate by increasing the coding rate when the base station 102/180 observes that the coding rate results in generation and transmission of a number of encoded packets that exceeds the quantity of encoded packets used for recovery of one data packet and/or when the base station 102/180 receives information from the UE 104 that indicates the UE 104 has successfully recovered the data packet at the current coding rate. Increasing the coding rate may result in a decrease of the number of encoded packets generated and transmitted for recovery of one data packet. In so doing, the decreased quantity of encoded packets generated and transmitted from encoding one data packet may be better reconciled with a theoretical minimum signaling for conveying the one packet given the channel conditions between transmitter (e.g., base station 102/180) and receiver (e.g., UE 104). Accordingly, some overhead at the transmitter and/or received may be reduced, and some interference on the channel may be avoided.

Complementarily, the base station 102/180 may adjust the coding rate by decreasing the coding rate when the base station 102/180 observes that the coding rate results in generation and transmission of a number of encoded packets that equal to the quantity of encoded packets used for recovery of one data packet (e.g., as the quantity of encoded packets used for recovery of one data packet cannot exceed the number of encoded packets generated for recovery of the one data packet according to the coding rate) and/or when the base station 102/180 receives information from the UE 104 that indicates the UE 104 has failed to successfully recover the data packet at the current coding rate. Decreasing the coding rate may result in an increase of the number of encoded packets generated and transmitted for recovery of one data packet. In so doing, the increased quantity of encoded packets generated and transmitted from encoding one data packet may improve the probability that the one data packet will be successfully recovered by the receiver given the channel conditions between transmitter (e.g., base station 102/180) and receiver (e.g., UE 104). Accordingly, the reliability of data transmission may be improved, for example, with a corresponding increase in latency and/or overhead that may be of a lesser degree than that commensurate with some retransmission procedures providing comparable data reliability improvements.

The base station 102/180 may encode data packets at the determined (e.g., adjusted or maintained) coding rate, which may be more reflective of the conditions on the channel on which the base station 102/180 transmits to the UE 104, e.g., when considered in tandem with the potential adverse effects of extra signaling, such as latency and consumption of computational resources consumption. In other words, the base station 102/180 may generate a set of encoded packets 198 by encoding a data packet at a coding rate that is based on a quantity of other encoded packets used for recovery of another data packet by the UE 104.

The base station 102/180 may then transmit the encoded packets 198, encoded at the coding rate that is based on the quantity of other encoded packets used for recovery of the other data packet, to the UE 104. The UE 104 may receive the encoded packets 198, and based thereon, the UE 104 may recover the original packet that the base station 102/180 encoded into the encoded packets 198. The recovered original packet may be passed up to the higher layers. The UE 104 may generate feedback (e.g., indicating ACK/NACK feedback) based on receiving the encoded packets 198, with the feedback indicating a quantity of the encoded packets 198 used for recovery of a data packet, which may be used to determine the coding rate at which to encode additional data packets, as described herein.

FIG. 2A is a diagram 200 illustrating an example of a first subframe within a 5G NR frame structure. FIG. 2B is a diagram 230 illustrating an example of downlink channels within a 5G NR subframe. FIG. 2C is a diagram 250 illustrating an example of a second subframe within a 5G NR frame structure. FIG. 2D is a diagram 280 illustrating an example of uplink channels within a 5G NR subframe. The 5G NR frame structure may be frequency division duplexed (FDD) in which for a particular set of subcarriers (carrier system bandwidth), subframes within the set of subcarriers are dedicated for either downlink or uplink, or may be time division duplexed (TDD) in which for a particular set of subcarriers (carrier system bandwidth), subframes within the set of subcarriers are dedicated for both downlink and uplink. In the examples provided by FIGS. 2A, 2C, the 5G NR frame structure is assumed to be TDD, with subframe 4 being configured with slot format 28 (with mostly downlink), where D is downlink, U is uplink, and F is flexible for use between downlink/uplink, and subframe 3 being configured with slot format 34 (with mostly uplink). While subframes 3, 4 are shown with slot formats 34, 28, respectively, any particular subframe may be configured with any of the various available slot formats 0-61. Slot formats 0, 1 are all downlink, uplink, respectively. Other slot formats 2-61 include a mix of downlink, uplink, and flexible symbols. UEs are configured with the slot format (dynamically through downlink control information (DCI), or semi-statically/statically through radio resource control (RRC) signaling) through a received slot format indicator (SFI). Note that the description infra applies also to a 5G NR frame structure that is TDD.

Other wireless communication technologies may have a different frame structure and/or different channels. A frame, e.g., of 10 milliseconds (ms), may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on downlink may be cyclic prefix (CP) orthogonal frequency-division multiplexing (OFDM) (CP-OFDM) symbols. The symbols on uplink may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies μ 0 to 4 allow for 1, 2, 4, 8, and 16 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and $2^\mu$ slots/subframe. The subcarrier spacing and symbol length/duration are a function of the numerology. The subcarrier spacing may be equal to $2^\mu * 15$ kilohertz (kHz), where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 microseconds (μs). Within a set of frames, there may be one or more different bandwidth parts (BWPs) (see FIG. 2B) that are frequency division multiplexed. Each BWP may have a particular numerology.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry at least one pilot and/or reference signal (RS) for the UE. In some configurations, an RS may include at least one demodulation RS (DM-RS) (indicated as $R_x$ for one particular configuration, where 100x is the port number, but other DM-RS configurations are possible) and/or at least one channel state information (CSI) RS (CSI-RS) for channel estimation at the UE. In some other configurations, an RS may additionally or alternatively include at least one beam measurement (or management) RS (BRS), at least one beam refinement RS (BRRS), and/or at least one phase tracking RS (PT-RS).

FIG. 2B illustrates an example of various downlink channels within a subframe of a frame. The physical downlink control channel (PDCCH) carries DCI within one or more control channel elements (CCEs), each CCE including nine RE groups (REGs), each REG including four consecutive REs in an OFDM symbol. A PDCCH within one BWP may be referred to as a control resource set (CORESET). Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the uplink.

FIG. 2D illustrates an example of various uplink channels within a subframe of a frame. The PUCCH may be located as indicated in one configuration. The PUCCH carries uplink control information (UCI), such as scheduling requests (SRs), a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
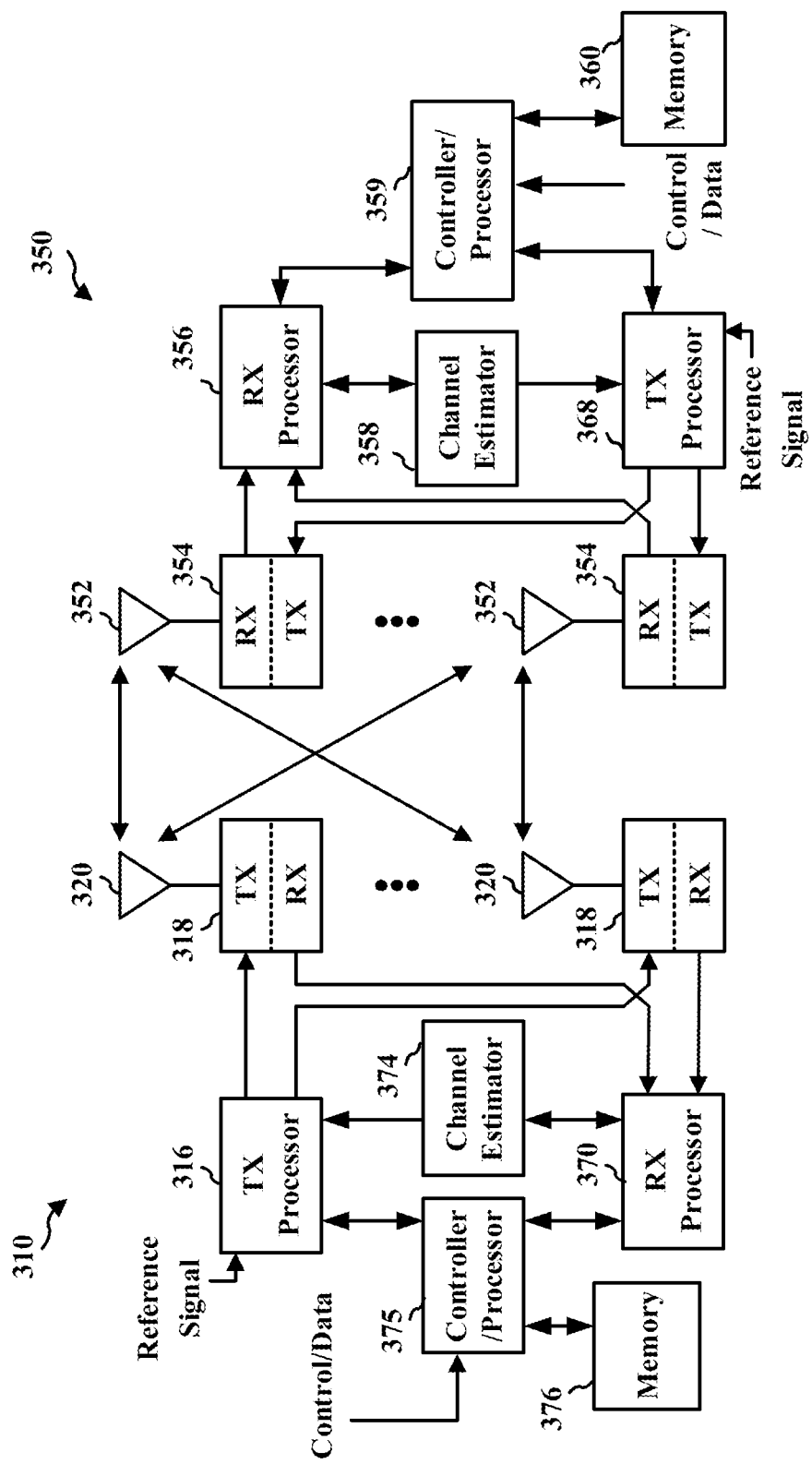
FIG. 3 is a diagram illustrating an example of a base station and user equipment (UE) in an access network.

FIG. 3 is a block diagram of a base station 310 in communication with a UE 350 in an access network. In the downlink, IP packets from the EPC 160 may be provided to a controller/processor 375. The controller/processor 375 implements Layer 3 (L3) and L2 functionality. L3 includes an RRC layer, and L2 includes a service data adaptation protocol (SDAP) layer, a packet data convergence protocol (PDCP) layer, an RLC layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter RAT mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The TX processor 316 and the RX processor 370 implement Layer 1 (L1) functionality associated with various signal processing functions. L1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate a radio frequency (RF) carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement L1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements L3 and L2 functionality.

The controller/processor 359 can be associated with a memory 360 that stores program codes and data. The memory 360 may be referred to as a computer-readable medium. In the uplink, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the downlink transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The uplink transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the uplink, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

In some aspects, at least one of the TX processor 368, the RX processor 356, and the controller/processor 359 may be configured to perform aspects in connection with encoding and/or decoding of data for NC, for example, as described in FIG. 1 in connection with the encoded packets 198 generated by encoding a data packet at a coding rate that is based on a quantity of other encoded packets used for recovery of another data packet 198 of FIG. 1.

In some other aspects, at least one of the TX processor 316, the RX processor 370, and the controller/processor 375 may be configured to perform aspects in connection with encoding and/or decoding of data for NC, for example, as described in FIG. 1 in connection with the encoded packets 198 generated by encoding a data packet at a coding rate that is based on a quantity of other encoded packets used for recovery of another data packet 198 of FIG. 1.

Figure 4:
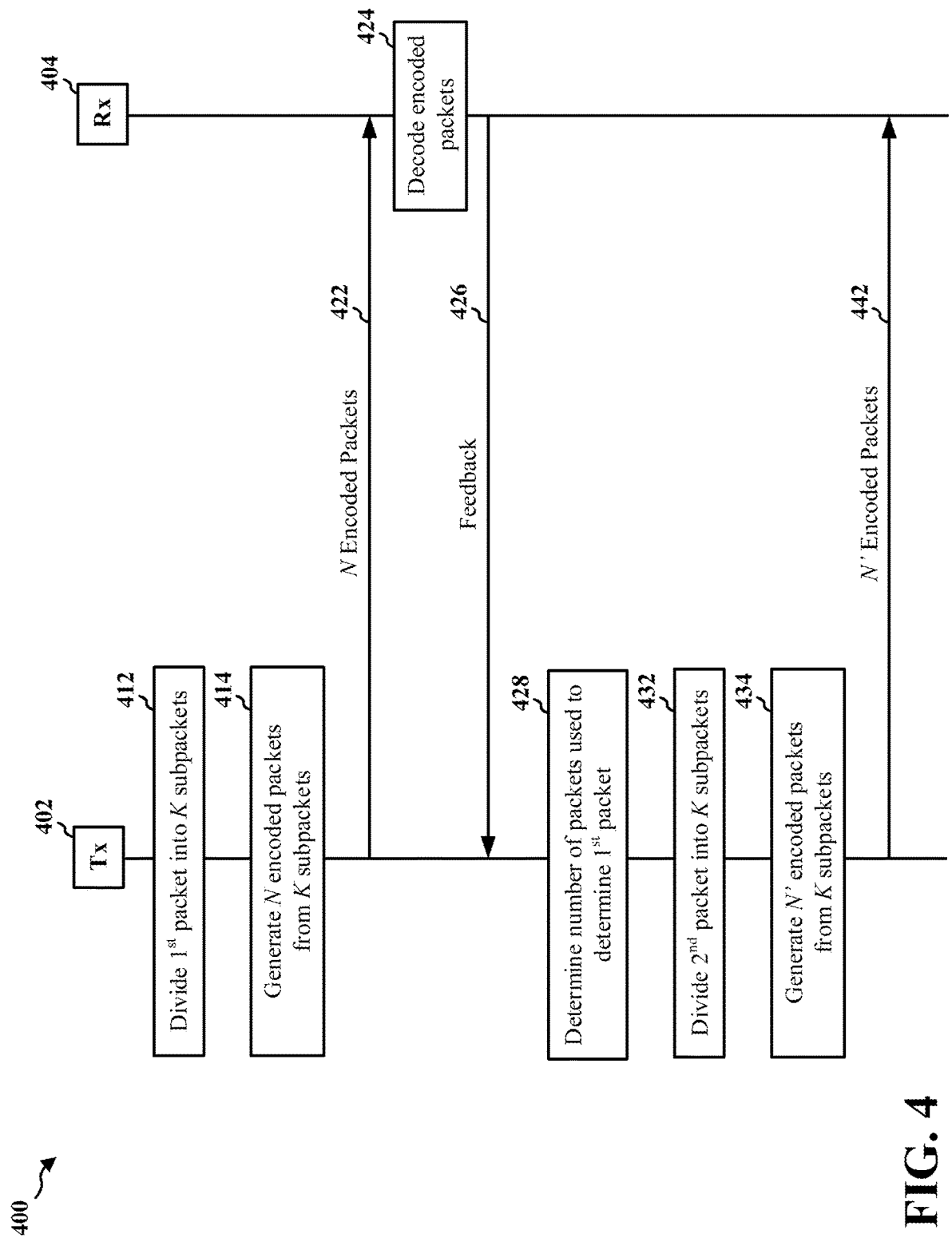
FIG. 4 is a call flow diagram illustrating example operations by a transmitter and a receiver for network coding (NC) communication for which the transmitter adapts a coding rate at which to encode data packets based on feedback from the receiver related to recovery of the data packets from encoded packets.

FIG. 4 is a call flow diagram illustrating example operations 400 by a transmitter 402 and a receiver 404 for NC communication for which the transmitter 402 adapts a coding rate at which to encode data packets based on feedback from the receiver 404 related to recovery of the data packets from encoded packets. According to various aspects, the transmitter 402 communicates with the receiver 404 over a network utilizing NC to communicate a series of packets from the transmitter 402 to the receiver 404 on the network. In some aspects, the transmitter 402 may be a base station and the receiver 404 may be a UE, or the transmitter 402 may be a UE and the receiver 404 may be a base station. In some other aspects, the transmitter 402 and the receiver 404 are both base stations or both UEs. In some aspects, the network may be a wireless communication network (e.g., a cellular communication network) operating on a mmW or near-mmW frequency spectrum, such as FR2. In some other aspects, the network may be a wireless communications networking operating on a sub-6 GHz band, such as FR1.

The transmitter 402 may determine to transmit a first packet to the receiver 404. The first packet may be a data packet, such as a data packet originating at an upper layer of a protocol stack. The first packet may be part of multiple packets, which may include data that is to be streamed to the receiver 404.

The transmitter 402 may divide 412 the first packet into K subpackets. Based on the division 412 of the first packet, the transmitter 402 may generate 414 encoded packets 422 from the K subpackets. In particular, the transmitter 402 may generate 414 the encoded packets 422 by encoding the first packet at a coding rate according to which a number N of encoded packets are generated from one data packet. The transmitter 402 may use a NC function to determine value of N. The network encoding function may account for a targeted error rate, encoding parameters, computation resources, and/or redundancy budget. In some aspects, the NC function may include a fountain code, such as a Raptor code or an LT code, or another rateless erasure code. In some examples, N may be determined using Equation 1:

$$N = k + \sum_{i=1}^{k-1} \left(\frac{s}{i}\right) + s\ln\left(\frac{s}{\delta}\right), \text{ where } s = c\ln\left(\frac{k}{\delta}\right)\sqrt{k} \quad \text{Equation 1}$$

In Equation 1, k is the number of subpackets (e.g., the K subpackets) being encoded, $\delta$ is the targeted decoding error probability, and c is a tunable parameter. In Equation 1, N may be proportional to c, e.g., if c increases, N increases. In some aspects, c may be a constant. However, c may be adjusted in different evaluations of Equation 1.

The transmitter 402 may transmit the N encoded packets 422 to the receiver 404. Upon receiving at least one of the N encoded packets 422, the receiver 404 may begin to decode 424 the received encoded packets to recover the first packet. The receiver 404 may use a decoding algorithm to decode 424 the encoded packets. In some aspects, the decoding algorithm may implement or may be associated with belief propagation decoding.

The receiver 404 may be able to determine the first packet after decoding M encoded packets of the N encoded packets. The value of M can vary, e.g., based on the channel quality between the transmitter 402 and the receiver 404. If the N encoded packets include more encoded packets than the M encoded packets used by the receiver 404 to recover the first packet, then the excess packets may waste network resources, increase network load and congestion, and/or decrease the performance of the network. If the N encoded packets include fewer encoded packets than the M encoded packets used by the receiver 404 to recover the first packet, then decoding may fail and the receiver 404 may not recover the first packet.

The receiver 404 may transmit feedback 426 to the transmitter 402. The feedback 426 may be based on whether the first packet was recovered by the receiver 404 and the number of encoded packets used to recover the first packet (e.g., the value of M). In some aspects, the feedback 426 may identify the value of M. The feedback 426 may explicitly include the value of M, e.g., as an entry in a RLC status report or in a PDCP status report. In some aspects, the feedback 426 may not explicitly indicate the value of M, but may include information which may allow the transmitter 402 to infer the value of M from the feedback 426. For example, the feedback may include acknowledgements in response to encoded packets of the N encoded packets 422 (e.g., acknowledged RLC PDUs, MAC layer HARQ/ACK feedback), and/or may include a confirmation indicating that the first packet has been recovered.

The transmitter 402 may determine 428 the number of packets used by the receiver 404 to determine the first packet (e.g., the value of M) from the N encoded packets 422. The transmitter 402 may utilize the feedback 426 to make this determination 428. Where the feedback 426 explicitly indicates the value of M, this may include receiving and identifying and/or extracting information indicating the value M from the feedback 426.

In some aspects, determining the value of M from the feedback 426 may include inferring the value of M based on the feedback 426. For example, the feedback 426 may include acknowledgements of encoded packets from the N encoded packets 422. The feedback 426 may also include a confirmation identifying that the receiver 404 has determined the first packet. Determining 428 the value of M may include counting the number of acknowledgements received in the feedback 426 before receiving the confirmation in the feedback 426.

The transmitter 402 may determine to transmit a second packet to the receiver 404. The second packet may be the packet immediately after the first packet in a series of packets to be transmitted from the transmitter 402 to the receiver 404, or may be another subsequent packet to be transmitted from the transmitter 402 to the receiver 404. As with the first packet, the transmitter 402 may divide 432 the second packet into K subpackets. The transmitter 402 may generate 434 N' encoded packets from the K subpackets. Upon generating the N' encoded packets, the transmitter 402 may transmit the N' encoded packets 442 to the receiver 404.

The transmitter 402 may determine the value of N' based on the feedback 426 and/or number of encoded packets of the N encoded packets used by the receiver 424 to determine the first packet (e.g., the value of M). Determining the value of N' will be discussed in further detail below. In some aspects, the transmitter 402 may generate 434 the N' encoded packets by tuning the NC function, which may include adapting the coding rate. For example, the transmitter 402 may change a parameter of the NC function (e.g., the tunable parameter c in Equation 1) to result in N' encoded packets. In some aspects, the transmitter 402 may include a NC update entity and a NC encoding entity. The NC update entity may set parameters of the NC function (e.g., change a tunable parameter of the NC function). The NC encoding entity may calculate N and N' based on the parameters. In some aspects, the transmitter 402 may generate the N' encoded packets based on the value of M without utilizing the NC function to determine the value of N', thereby reducing the computation resources required to generate the encoded packets.

By determining the number of NC encoded packets transmitted for a given packet based on the number of encoded packets utilized to decode a previous packet, the transmitter 402 and the receiver may reduce redundancy in the NC, may reduce NC computation complexity, may reduce delay in communicating over the network, and may save network resources.

In some aspects, the transmitter 402 may determine the value of N' based on the value of M and based on the number of encoded packets that had already been transmitted by the transmitter 402 when the receiver 404 successfully determined the first packet from the M encoded packets. By comparing the number of encoded packets used to recover the first packet with the number of encoded packets transmitted to the receiver 404 at the time the first packet was recovered, the transmitter 402 may determine a number of encoded packets which were transmitted to the receiver 404 but were not received at the receiver 404. The transmitter 402 may account for a similar number of lost packets in determining N', the number of encoded packets transmitted for subsequent packets.

For example, the transmitter 402 may generate 16 encoded packets based on a first packet (N=16), and may begin transmitting the 16 encoded packets to the receiver 404. The receiver 404 may determine the first packet after decoding 10 encoded packets of the 16 encoded packets (M=10). The transmitter 402 may determine that it had transmitted 12 encoded packets of the 16 encoded packets at the time that the receiver 404 had received 10 encoded packets and determined the first packet based on the 10 encoded packets. Accordingly, the transmitter 402 may determine that two of the 12 encoded packets were lost in transmission. In determining N' for transmission of subsequent packets, the transmitter 402 may therefore account for a similar number of lost encoded packets. In some aspects, the transmitter 402 may provide N' with two or more additional encoded packets than the receiver 404 is expected to use to determine the original packet. In some aspects, the transmitter 402 may provide N' with 20% more encoded packets than the receiver 404 is expected to use to determine the original packet.

In some aspects, in generating 414 the N encoded packets, the transmitter 402 may determine the value of N for one or more packets based on a NC function and an offset, e.g., by increasing the value determined based on the NC function by the offset. For example, for the initial packet transmitted from the transmitter 402 to the receiver 404, the transmitter may determine a number of packets using the NC function and may increase that number by the offset. By transmitting additional encoded packets in the form of the offset, the transmitter 402 may increase the probability that the receiver 404 receives a sufficient amount of encoded packets to decode the original packet. Decoding results of one or more original packets may be included in the feedback 426, which may indicate and/or may be used to derive the number of encoded packets used to determine (e.g., recover, reconstruct, etc.) the original packet, allowing the transmitter 402 to determine 428 the number of encoded packets used to recover the first packet and/or to generate 432 a number N' of encoded packets from encoding another original packet at a coding rate that may be adjusted based on the feedback 426.

Figure 5:
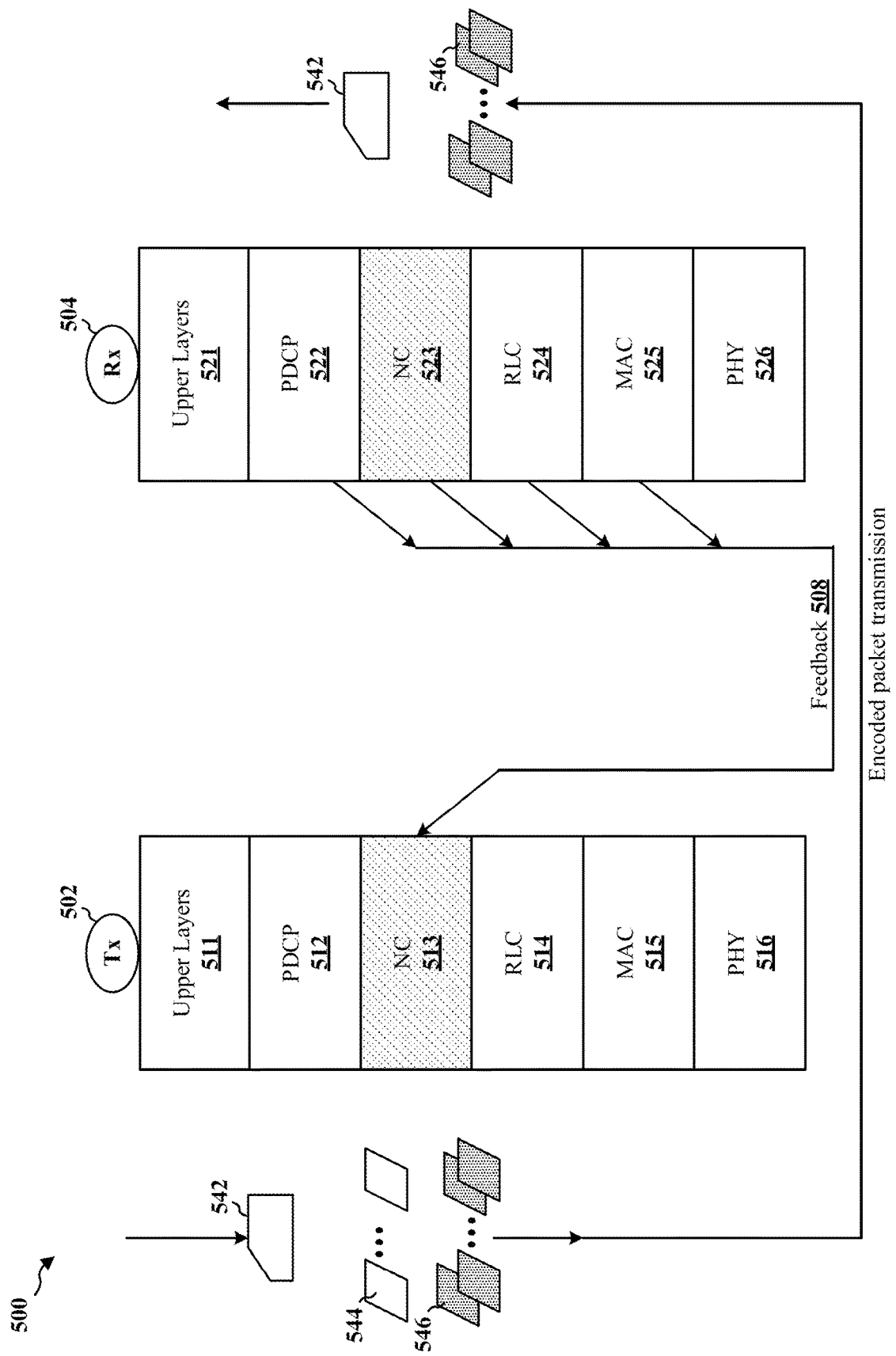
FIG. 5 is a block diagram illustrating a protocol stack of a transmitter and a protocol stack of a receiver that are configured for NC communication in which a coding rate at which to encode data packets is adapted based on feedback related to recovery of data packets from encoded packets.

FIG. 5 is a block diagram 500 illustrating a protocol stack of a transmitter 502 and a protocol stack of a receiver 504 that are configured for NC communication in which a coding rate at which to encode data packets is adapted based on feedback related to recovery of data packets from encoded packets. Each of the transmitter 502 and the receiver 504 includes a respective set of layers to implement at least a portion of a RAN or other network protocol stack. According to various aspects, one or more layers may be added, omitted, or transposed.

A respective set of layers, with which each of the transmitter 502 and the receiver 504 are configured, may each include a network protocol stack that implements at least a portion of Layer 2 and Layer 1 functionality in a network. For example, a set of layers at each of the transmitter 502 and receiver 504 may form part of a RAN protocol stack, such as a 5G NR protocol stack. In some other aspects, the transmitter 502 and/or receiver 504 may be configured with different and/or additional protocol stacks, such as a transmission control protocol (TCP)/IP stack, Bluetooth or Bluetooth Low Energy stack, an open systems interconnection (OSI) model stack, or other similar network protocol stack.

The protocol stack for the transmitter 502 includes a PDCP layer 512, an RLC layer 514, a MAC layer 515, and a PHY layer 516. As illustrated, the protocol stack may further include an NC layer 513, which may be a sublayer of another layer. For example, the functionality of the NC layer 513 may be implemented as an NC sublayer at the PDCP layer 512 or at the RLC layer 514. Potentially, the functionality of the NC layer 513 may be implemented across two or more layers. In addition, one or more upper layers 511 may reside above the PDCP layer 512. In some aspects, the upper layers 511 may implement some functionality of a RAN or other network protocol stack. For example, the upper layers 511 may include one or more layers at Layer 2 (e.g., SDAP layer) and/or at Layer 3 (e.g., RRC layer). Additionally or alternatively, the upper layers 511 may further also include some layers that reside above, but are not part of, a radio protocol stack. Operating as a transmitter 502, the upper layers 511 may further include a layer that functions as a point of origin for data—e.g., the payload of a data packet may include data originating at an application layer, RRC layer, L3, or other layer above the NC layer 513 of the transmitter 502.

Similar to the transmitter 502, the receiver 504 may be configured with a protocol stack that may include a PDCP layer 522, a RLC layer 524, a MAC layer 525, and a PHY layer 526. Corresponding to the transmitter 502, the receiver 504 may include an NC layer 523, which may be a sublayer of another layer, such as the PDCP layer 522 and/or at the RLC layer 524. As with the transmitter 502, the receiver 504 may include one or more upper layers 521, which may include one or more layers residing above the PDCP layer 522, and potentially, residing above the network and/or radio access layers of the protocol stack. Operating as a receiver 504, the upper layers 511 may further include a layer that functions as a destination for data—e.g., the payload of a data packet may include data addressed to or otherwise intended for an application layer, RRC layer, L3, or other layer above the NC layer 523 of the receiver 504.

Packets transmitted from the transmitter 502 to the receiver 504 may be processed down through the protocol stack of the transmitter 502, until reaching the PHY layer 516 (e.g., L1) of the transmitter 502, at which the packets may be transmitted over the air to the receiver 504. The receiver 504 may receive the data at the PHY layer of the receiver 504 and may process the received packets up through the protocol stack for the receiver 504.

At the NC layer 513 of the transmitter 502 and the NC layer 523 of the receiver 504 may enable the transmitter 502 and the receiver 504 to utilize NC to communicate a packet, or a stream of packets, over a network. The upper layers 511 of the transmitter 502 may generate and packetize data to be transmitted to the receiver 504, and so, the upper layers 511 may pass a data packet 542 down the protocol stack for transmission. The data packet 542 may include data from one or more upper layers 511 that has been packetized or otherwise discretely organized, as with PDUs and SDUs (e.g., depending on the layer perspective). A layer lower than the upper layers 511, such as the NC layer 513, may receive the data packet 542 (e.g., as PDCP PDUs) and may divide the data packet 542 into uncoded subpackets 544, the number of which may be equal to K. By way of illustration and not limitation, the uncoded subpackets 544 may be similar in form and/or function to FEC blocks.

In some aspects, the uncoded subpackets 544 may be approximately uniform in size (e.g., as measured in bits, bytes, octets, or another metric representative of data size). For example, the NC layer 513 may divide the data packet 542 into the uncoded subpackets 544 based on one or more fixed or configurable parameters and/or variables, such as a parameter that specifying a data size (or range of data sizes) targeted for each subpacket and/or a parameter that defines the number of subpackets into which each data packet is divided. Potentially, each data packet may be of an approximately equal size when the NC layer 513 is reached. For example, the size of each data packet may be a function of a bitrate for transmission or another constraint that may be dictate the (approximate) size of each data packet. In some configurations, the number of uncoded subpackets (e.g., the K uncoded subpackets 544) into which a data packet is divided may be dictated by an NC function and/or a coding rate at which data packets are encoded.

The NC layer 513 of the transmitter 502 may encode the K uncoded subpackets 544 to generate encoded packets 546, the number of which may be equal to N. For example, the NC layer 513 may encode redundant data from the K uncoded subpackets 544, with the degree of redundancy being a function of a coding rate at which data is encoded. The NC layer 513 of the transmitter 502 may utilize at least one NC algorithm to encode the uncoded subpackets 544 into the encoded packets 546, such as an LT code, Raptor code, another fountain code, or another rateless erasure code (that is, so that the coding rate is configurable and not fixed).

In some aspects, the NC layer 513 may calculate the number N of encoded packets to be generated from each set of k uncoded subpackets (or each data packet), e.g., according to calculation(s) of the NC algorithm. For example, the NC layer 513 may determine (e.g., collect, measure, observe, etc.) a set of variables, which may be input into the NC algorithm to calculate the number N of encoded packets to be generated from k uncoded subpackets (or one data packet) when the NC algorithm is executed. Such variables may include a target error rate, computation resources, redundancy budget, encoding parameters, and/or another variable(s).

In some instances, the NC layer 513 may be configured to offset the number of encoded packets to be generated, such as by adding an integer offset to the result of Equation 1. For example, the NC layer 513 may add an offset to the calculated number N of encoded packets to be generated at a coding rate. The NC layer 513 may apply such an offset for a coding rate at which data is encoded for an initial transmission to the RX 504, e.g., before any feedback has been received from the RX 504. In effect, the offset may compensate for poor network conditions that the TX 502 did not a priori know and/or did not estimate to occur (or poor network conditions the cause more missing data than an initial coding rate to which the TX 502 is configured to default).

When encoding the data packet 542 into the encoded packets 546 (which may include dividing the data packet 542 into the uncoded subpackets 544), the NC layer 513 may follow a coding rate, which may indicate the number N of encoded packets to be generated from encoding each data packet. For example, the NC algorithm implemented at the NC layer 513 may be rateless, e.g., where the coding rate is not fixed, as with fountain codes. In some aspects, the coding rate may be dynamically adapted, e.g., such that coding rate can be adjusted for a link that is already established and/or while the transmitter 502 is actively transmitting. For example, the coding rate may be adapted mid-data stream so that some data packets of the data stream are encoded at one coding rate and other data packets of the data stream are encoded at another coding rate. The coding rate may be adapted to address some time-variant factors directly or indirectly affecting communication with the receiver 504 (e.g., based on information received from the receiver 504).

In some aspects, the coding rate indicates a ratio of one (1) data packet to N encoded packets, with N being the number of encoded packets from which the receiver 504 can recover one data packet, e.g., according to a number of erasures with which the N encoded packets are estimated by the transmitter 502 to include when received by the receiver 504. By way of illustration and not limitation, a coding rate may adapted to one data packet to twenty encoded packets—that is, each data packet may be encoded such that twenty encoded packets are generated (e.g., from k uncoded subpackets into which the one data packets is divided).

In some aspects, the encoded packets may include some erasure correction information, such as redundancy, which may allow the receiver 504 to "correct" or recover some or all of an uncoded subpacket when erasures occur in the encoded packets and/or when some encoded packets are missing at the receiver 504. If no erasures were to occur, a data packet may be recoverable by a receiver from a set of encoded packets having an aggregate size approximately equal to or slightly larger than the size of the original data packet without encoding. In some other aspects, however, the coding rate may be adapted to be a different ratio other than 1 data packet to N coded packets.

The coding rate at which the NC layer 513 of the transmitter 502 encodes some data packets may be adapted based on feedback from the receiver (e.g., feedback including information of a similar or same type as the feedback 508). Feedback from the receiver 504, including the feedback 508, may include information provided from one or more layers of the receiver 504. For example, the feedback may include information from one or more of the PDCP layer 522, the NC layer 523, the RLC layer 524, the MAC layer 525, one or more other layers, and/or any combination of layers at the receiver 504. Feedback upon which a coding rate can be based may include any information explicitly or implicitly indicating a quantity of packets used for recovery of a data packet by the receiver 504 and/or indicating that recovery of a data packet is complete (whether successful or unsuccessful).

Feedback may be received at the NC layer 513, at which the feedback may be used to determine (e.g., calculate, compute, scale) whether, how much, and/or in what direction the coding rate should be adjusted, e.g., for subsequent data packets transmitted to at least the receiver 504. As feedback may be provided from different layers of the receiver 504, feedback may be correspondingly intended for different layers of the transmitter 502, although the feedback may be used in determining the coding rate at the NC layer 513 notwithstanding the layer for which the feedback is intended. Further, feedback may include more than one discrete message, such as two or more messages transmitted and/or received at different times or two or more messages having separate headers or other identifying information.

Following generation of the encoded packets 546, the NC layer 513 of the transmitter 502 may forward the encoded packets 546 to the RLC layer 514 of the transmitter 502. The RLC layer 514 of the transmitter 502 may generate RLC PDUs based on the encoded packets 546. The encoded packets 546 may continue down the protocol stack for transmission processing at the lower layers, such as the MAC layer 515, which may associate the encoded packets 546 (or PDUs containing encoded packets 546) with a HARQ process on which ACK and/or NACK messages may be received.

The receiver 504 may receive the encoded packets 546 at the PHY layer 526, and the encoded packets 546 may be passed up the protocol stack. At the MAC layer 525, the received encoded packets 546 may be associated with a HARQ process, and respective ACK or NACK information may be transmitted to the transmitter 502 in response to receiving each of the encoded packets 546 at the MAC layer 525. For example, ACK information may be provided by the receiver 504 for each of the encoded packets 546 successfully received at the PHY layer 526 and delivered to the MAC layer 525 of the receiver 504. In some aspects, the feedback 508 may include one or more messages having ACK or NACK information for one or more of the encoded packets 546.

Further, the encoded packets 546 may reach the NC layer 523 as RLC PDUs from the RLC layer 524 of the receiver 504. The NC layer 523 may place one or more of the encoded packets 546 in a queue or buffer, e.g., as RLC PDUs to avoid errors and/or lost data caused by decoding latency and/or as uncoded subpackets to be reordered or otherwise held for reconstruction of the data packet 542. At the NC layer 523, the data packet 542 may be recovered using the encoded packets 546. For example, the NC layer 523 of the receiver 504 may extract the encoded packets 546 from the RLC PDUs, and may decode the encoded packets 546 to recover the original data packet 542. In some aspects, decoding the encoded packets 546 may include recovering uncoded subpackets that each includes a segment of the original data packet 542. For example, the NC layer 523 may recover uncoded subpackets from the encoded packets 546 such that decoding the encoded subpackets is effectively the inverse of the encoding applied at the NC layer 513 of the transmitter 502, and therefore, the recovered uncoded subpackets may be the same or nearly the same as the uncoded subpackets 544 into which the data packet 542 was divided before encoding.

In some aspects, the feedback 508 may include information from the NC layer 523 related to a decoding status of some or all of the encoded packets 546. For example, the feedback 508 may include an indication of whether the data packet 542 was successfully recovered, such as an indication of ACK information when a data packet is successfully recovered or NACK information when a data packet is not successfully recovered—e.g., recovery of a data packet may be unsuccessfully completed when a decoding error(s) prevents the recovery of one or more uncoded subpackets, when the number of encoded packets 546 that are dropped or lost prohibits recovery of some or all of the data packet 542, and/or when the data packet 542 includes a non-negligible number of uncorrectable errors may fail). In some aspects, the NC layer 523 may perform a data integrity or error detection check to determine whether recovery of the data packet 542 is successfully completed, such as with a cyclic redundancy check (CRC), hash function, or other error detection code or parity information.

According to some configurations, the NC layer 523 may perform an error detection or data integrity check using an expected result appended to the data packet 542 and/or a respective expected result appended to each uncoded subpacket 544 at the transmitter 502 before encoding the data packet 542, such as an expected string, an expected hash value, or other expected information that may form a satisfactory basis for error detection or data integrity validation. Accordingly, an expected error detection or data integrity result may be found during recovery of the data packet 542 or each uncoded subpacket. The recovered error detection or data integrity result may be recovered for the data packet 542 as a whole or may be recovered for each uncoded subpacket having a segment of the data packet 542 (e.g., each uncoded subpacket recovered by the NC layer 523 of the receiver 504 may include a respective error detection or data integrity result).

The NC layer 523 may determine (e.g., compute, calculate, obtain) an observed result, such as by providing the data packet 542 or an uncoded subpacket thereof as input to a CRC or hash function (or another error detection or data integrity function) that is configured to output the same result given the same input as a corresponding function used to generate the expected result at the transmitter 502. The NC layer 523 may compare the recovered expected result with the determined observed result to verify whether the data packet 542 was accurately recovered and decoding the encoded packets 546 is successfully completed.

If the recovered data packet 542 does not pass the data integrity check, such as where the expected result is different from the observed result and/or where error detection code indicates an error(s) (e.g., an uncorrectable error), then the integrity of the data packet 542 may be corrupted and/or the received number of encoded packets 546 may be insufficient to recover the data packet 542. In some aspects, the NC layer 523 may discard the data packet 542, and may provide information intended for the NC layer 513 of the transmitter 502 indicating the failed recovery of the data packet recovery and/or indicating recovery of the data was unsuccessful. Such information that indicates failed data packet recovery may be included in one or more messages of the feedback 508.

If the data packet 542 is successfully recovered (e.g., one or more applicable data integrity check(s) are passed and/or the data packet 542 is reconstructed from recovered uncoded subpackets), the NC layer 523 of the receiver 504 may push the recovered data packet 542 to the PDCP layer 522, and the recovered data packet 542 may be provided to (and/or through) one or more of the upper layers 521. For example, the recovered data packet 542 may be provided to an application layer of the receiver 504.

The receiver 504 may report feedback 508 related to the number of encoded packets utilized to recover the original packet. In some aspects, the receiver 504 may further transmit information indicating whether the receiver 504 was able to successfully recover the original data packet 542, e.g., such that an error rate or amount of the data packet 542 lost or otherwise unrecovered is suitable for deliver to one or more upper layers 521. Such information may be included in the feedback 508 or may be separately communicated to the transmitter 502.

Feedback 508 from the receiver 504 to the transmitter 502 may be processed down through the protocol stack for the receiver 504 and transmitted to the transmitter 502 at the PHY layer of the transmitter 502. The transmitter 502 may receive the feedback 508 at the PHY layer of the transmitter 502 and may process the received transmission up through the protocol stack for the receiver 504.

In some aspects, the feedback 508 includes a PDCP status report. The PDCP layer 522 may generate the PDCP status report, and may include a field which indicates the number of encoded packets utilized by the NC layer 523 to determine the original data packet 542. The PDCP layer 522 may forward the PDCP status report to the NC layer 523 and down the protocol stack for transmission to the transmitter 502. The transmitter 502 may receive the PDCP status report and, at the NC layer 513, may determine the number of encoded packets used to recover the original data packet 542 based on information indicated in the field in the PDCP status report.

In some aspects, the feedback 508 includes an RLC status report. The RLC layer 524 may generate the RLC status report, and may include a field which identifies the number of encoded packets utilized by the NC layer 523 to determine the original packet. Specifically, the receiver 504 may count the RLC PDUs received at the RLC layer 524, and may transmit a RLC status message with a field indicating the number of received RLC PDUs upon determination that the original packet has been recovered. The RLC layer 524 may forward the RLC status report down the protocol stack for transmission to the transmitter 502. The transmitter 502 may receive the RLC status report and, at the NC layer 513, may determine the number of encoded packets used to recover the original data packet 542 based on information indicated in the field in the RLC status report.

In some aspects, the feedback 508 includes at least one PDCP and/or RLC status report(s) and/or ACK/NACK information related to the encoded packets 546 (e.g., ACK/NACK information for RLC PDUs that include encoded packets 546). The RLC layer 524 may generate the RLC status report and, in instances in which an acknowledgement mode is enabled, the RLC status report may include ARQ ACK/NACK information acknowledging RLC PDUs having encoded packets 546 that are successfully received from the transmitter 502 at the RLC layer 524 of the receiver 504. The RLC layer 524 may forward the RLC status report down the protocol stack for transmission to the transmitter 502. The transmitter 502 may receive the RLC status report and may count the number of acknowledgements of RLC PDUs having encoded packets 546. By way of illustration and not limitation, where each RLC PDU at the receiver 504 includes one of the received encoded packets 546 or the number of received encoded packets 546 contained in each RLC PDU at the receiver 504 is readily ascertainable, the transmitter 504 may deduce the quantity of encoded packets 546 successfully received by the RLC layer 524 of the receiver 504, and presumptively provided to the NC layer 523, according to the ACK/NACK information. Effectively, the ACK/NACK information may serve as an implicit indication of the number of encoded packets 546 passed to the NC layer 523 for the recovery of the data packet 542. In some aspects, the NC layer 513 may access the RLC status report (e.g., via an interface and/or one or more RLC PDUs), and so may derive the quantity of encoded packets 546 successfully received by the RLC layer 524 and used to recover the data packet 542.

Following the ACK/NACK information, the RLC layer 524 may further provide information indicating recovery of the data packet 542 is complete in the feedback 508, in the same or in a different message of the feedback 508 that indicates the ACK/NACK information for RLC PDUs having encoded packets 546. The information indicating recovery of the data packet 542 is complete may indicate whether the recovery is successfully completed or unsuccessfully completed—e.g., other ACK/NACK information different from the HARQ ACK/NACK and the RLC (e.g., ARQ) ACK/NACK information may be used where ACK information indicates that recovery of the data packet 542 is successfully completed and NACK information indicates that recovery of the data packet 542 is unsuccessfully completed.

Upon receiving information indicating that the receiver 504 has decoded the original data packet 542, and so recovery of the data packet 542 is complete, the transmitter 502 may tally the number of acknowledgements respectively corresponding to RLC PDUs having encoded packets 546 to infer the number of encoded packets used to determine the original packet. For example, the NC layer 513 may sum the number of acknowledgements received over a time period between the recovery of the data packet 542 being completed, as indicated by information in the feedback 508, and recovery of the immediately preceding data packet being completed, e.g., as acknowledgements received outside of such a time period may correspond to other encoded packets into which other data packets are encoded.

In some aspects, the feedback 508 includes HARQ ACK/NACK information generated by the MAC layer 525 of the receiver 504 based on MAC PDUs into which one or an ascertainable number of the encoded packets 546 are packetized. The transmitter 502 may determine that MAC PDUs having encoded packets 546 successfully received by the receiver 504, and presumptively provided to the NC layer 523, based on the number of MAC PDUs that are acknowledged through HARQ ACK/NACK information in the feedback 508. The NC layer 513 of the transmitter 502 may determine (e.g., calculate, sum, count) the number of acknowledgements that implicitly indicate the receiver 504 successfully received one of the encoded packets 546 into which the data packet 542 is encoded, such as by summing all acknowledgements corresponding to (e.g., transmitted within, received within, having a timestamp falling within) a time period before completion of recovery of the data packet 542 and after completion of recovery of another data packet immediately before recovery of the data packet 542, e.g., as acknowledgements received outside of such a time period may correspond to other encoded packets into which other data packets are encoded. Upon receiving confirmation that the receiver 504 has decoded the original packet, the transmitter 502 may utilize the counted acknowledgements to infer the number of encoded packets used to determine the original packet.

Figure 6:
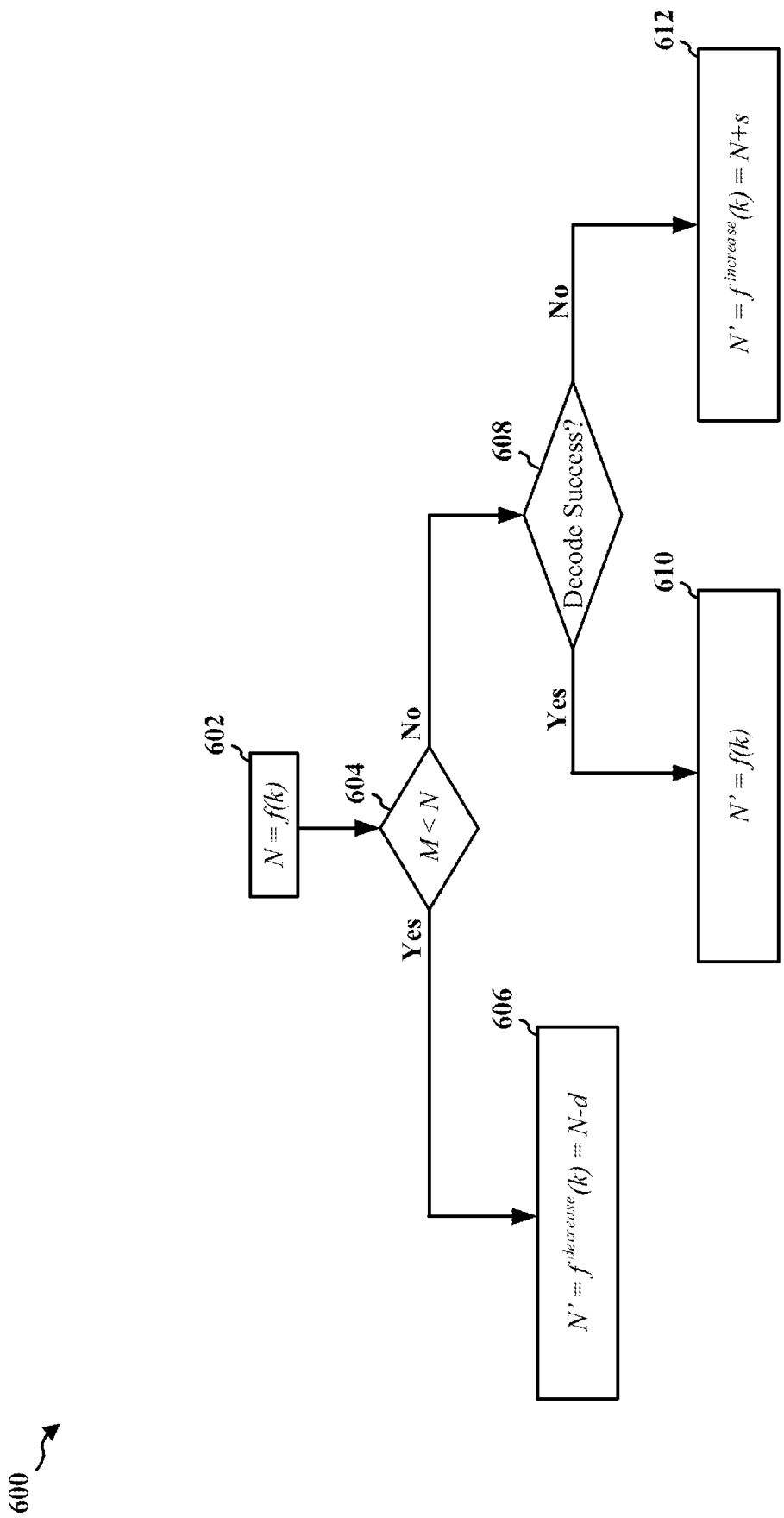
FIG. 6 is a flowchart illustrating example operations for adapting a coding rate at which to encode data packets based on a quantity of encoded packets used to recover other data packets.

FIG. 6 is a flowchart 600 illustrating example operations for adapting a coding rate at which to encode data packets based on a quantity of encoded packets used to recover other data packets. The example operations may be performed at a transmitting side when transmitting packets according to NC. For example, the illustrated operations may be performed by the transmitter 402 of FIG. 4 and/or the transmitter 502 of FIG. 5. In some aspects, the example operations may be performed by a base station, such as the base station 102/180 of FIG. 1 or the base station 310 of FIG. 3. In some other aspects, the example operations may be performed by a UE, such as the UE 104 of FIG. 1 or the UE 350 of FIG. 3.

At 602, the transmitter determines a number N of encoded packets to transmit for NC of a first packet, e.g., based on a NC function $f(k)$. For example, the NC function $f(k)$ may be or may include Equation 1, described above. The transmitter may determine N from implicit and/or explicit information, as N may be defined by a coding rate controlling the number of encoded packets generated and transmitted for each packet, including the first packet.

The transmitter encodes the first packet, which results in generation of N encoded packets. The transmitter may transmit the N encoded packets to a receiver. Subsequently, the transmitter determines M, the quantity (or number) of encoded packets used by the receiver to determine the first packet has been successfully or unsuccessfully decoded, if such information is provided by the receiver. The transmitter may determine M based on feedback from the receiver. Upon determining M (or determining that M does not exist because the receiver failed to decode the first packet), the transmitter may determine N', the number of encoded packets to transmit for a second packet subsequent to the first packet. The transmitter may implicitly or indirectly determine N' by adjusting the coding rate.

At 604, the transmitter determines if M is less than N. If so, the N encoded packets were more than needed to determine the first packet. At 606, the transmitter may determine N' based on a second NC function $f^{increase}(k)$. The second NC function is tuned to result in fewer encoded packets than the first NC function $f(k)$. For example, the second NC function $f^{increase}(C)$ may be the first NC function $f(k)$ with a tunable parameter decreased. Specifically, N' determined based on the second NC function $f^{increase}(k)$ will result in N−d, where d is a set decrease value.

At 604, if the transmitter determines that M is not less than N (e.g., M is equal to N or M does not exist because the first packet was not decoded successfully), the transmitter determines at 608 if the first packet was decoded successfully. If so, all of the N encoded packets were utilized to determine the first packet. Accordingly, at 610, the transmitter may determine N' utilizing the same encoding function $f(k)$, which may result in N'=N. If the transmitter determines at 608 that the first packet was not decoded successfully, the N encoded packets were not enough to determine the first packet. Accordingly, at 612, the transmitter may determine N' based on a third NC function $f^{increase}(k)$. The third NC function is tuned to result in more encoded packets than the first NC function $f(k)$. For example, the third NC function $f_{increase}(k)$ may be the first NC function $f(k)$ with a tunable parameter increased. Specifically, N' determined based on the third NC function $f^{increase}(k)$ will result in N+s, where s is a set increase value.

Figure 7:
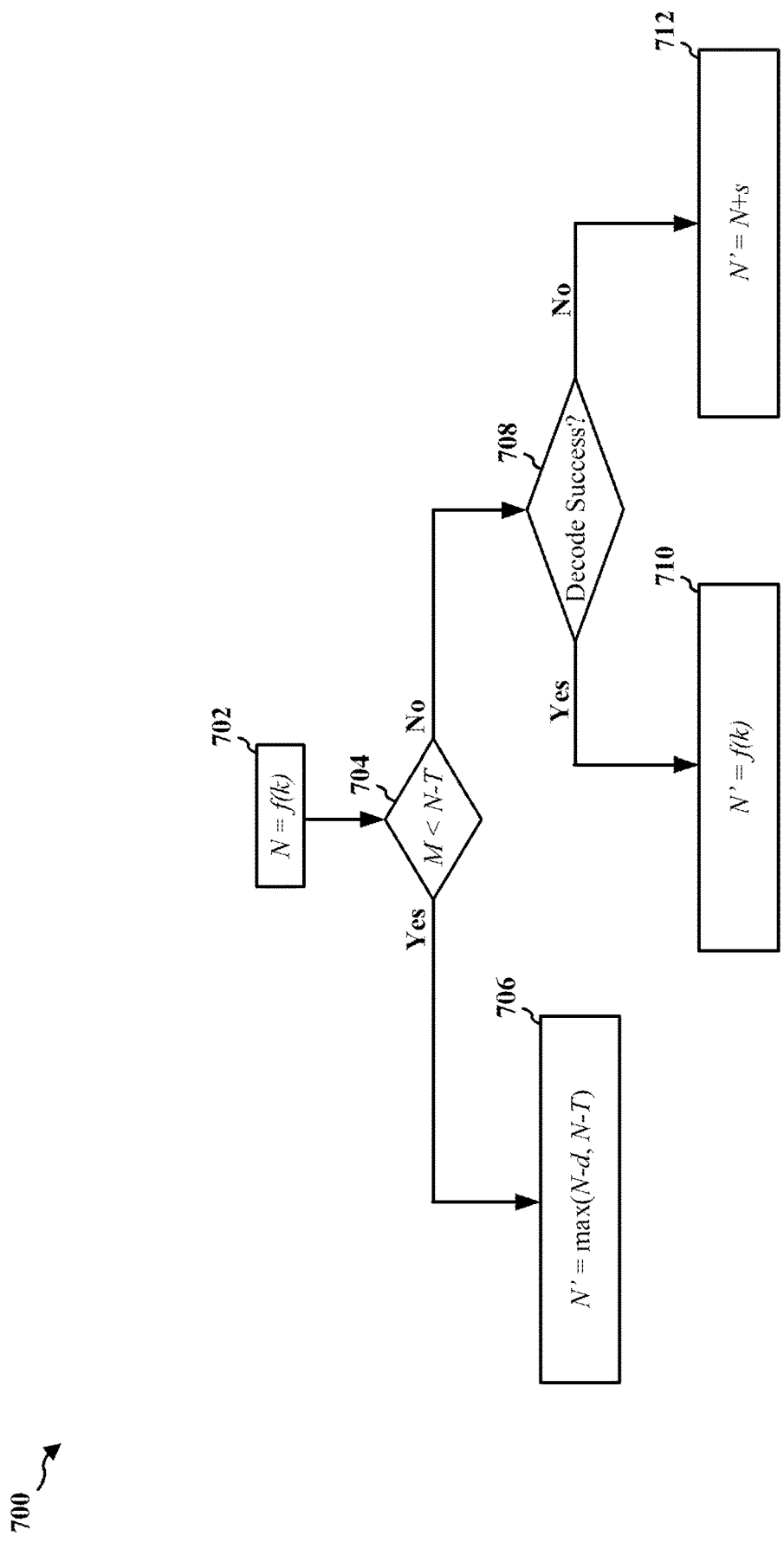
FIG. 7 is a flowchart illustrating other example operations for adapting a coding rate at which to encode data packets based on a quantity of encoded packets used to recover other data packets.

FIG. 7 is a flowchart 700 illustrating other example operations for adapting a coding rate at which to encode data packets based on a quantity of encoded packets used to recover other data packets. The example operations may be performed at a transmitting side when transmitting packets according to NC. For example, the illustrated operations may be performed by the transmitter 402 of FIG. 4 and/or the transmitter 502 of FIG. 5. In some aspects, the example operations may be performed by a base station, such as the base station 102/180 of FIG. 1 or the base station 310 of FIG. 3. In some other aspects, the example operations may be performed by a UE, such as the UE 104 of FIG. 1 or the UE 350 of FIG. 3.

At 702, the transmitter determines N, the number of encoded packets to transmit for a first packet, based on a NC function $f(k)$. For example, the NC function $f(k)$ may be Equation 1, described above. The transmitter generates the N encoded packets and transmits the N encoded packets to a receiver. Subsequently, the transmitter determines M, the number of encoded packets used by the receiver to determine the first packet, if the receiver successfully decoded the first packet. The transmitter may determine M based on feedback from the receiver, as described above. Upon determining M (or determining that M does not exist because the receiver failed to decode the first packet), the transmitter may determine N', the number of encoded packets to transmit for a second packet subsequent to the first packet.

At 704, the transmitter determines if M is less than N minus a threshold value T (e.g., if M<N−T). If so, at 706, the transmitter may determine N' to be the larger of N−T and N−d, where d is a set decrease value.

At 704, if the transmitter determines that M is not less than N minus the threshold value T (e.g., M is equal to N−T or M does not exist because the first packet was not decoded successfully), the transmitter determines at 708 if the first packet was decoded successfully. If so, at 710, the transmitter may determine N' utilizing the same encoding function ƒ(k), which may result in N'=N. If the transmitter determines at 708 that the first packet was not decoded successfully, at 712, the transmitter may determine N' to be N+s, where s is a set increase value.

For example, the target value for N is a set level above M, represented by the threshold value T. If the transmitter determines M is equal to N-T, the target value for N has been achieved and the transmitter continues to set N' to N. If the transmitter determines that Nis higher or lower than the target value, the transmitter steps the value of N down (in increments of d) or up (in increments of s) until the target value of N is achieved.

For example, if the transmitter determines M is equal to N, the target value for N has been achieved and the transmitter continues to set N' to N. If the transmitter determines that N is higher or lower than the target value, the transmitter steps the value of N down (in increments of d) or up (in increments of s) until the target value of N is achieved.

Figure 8:
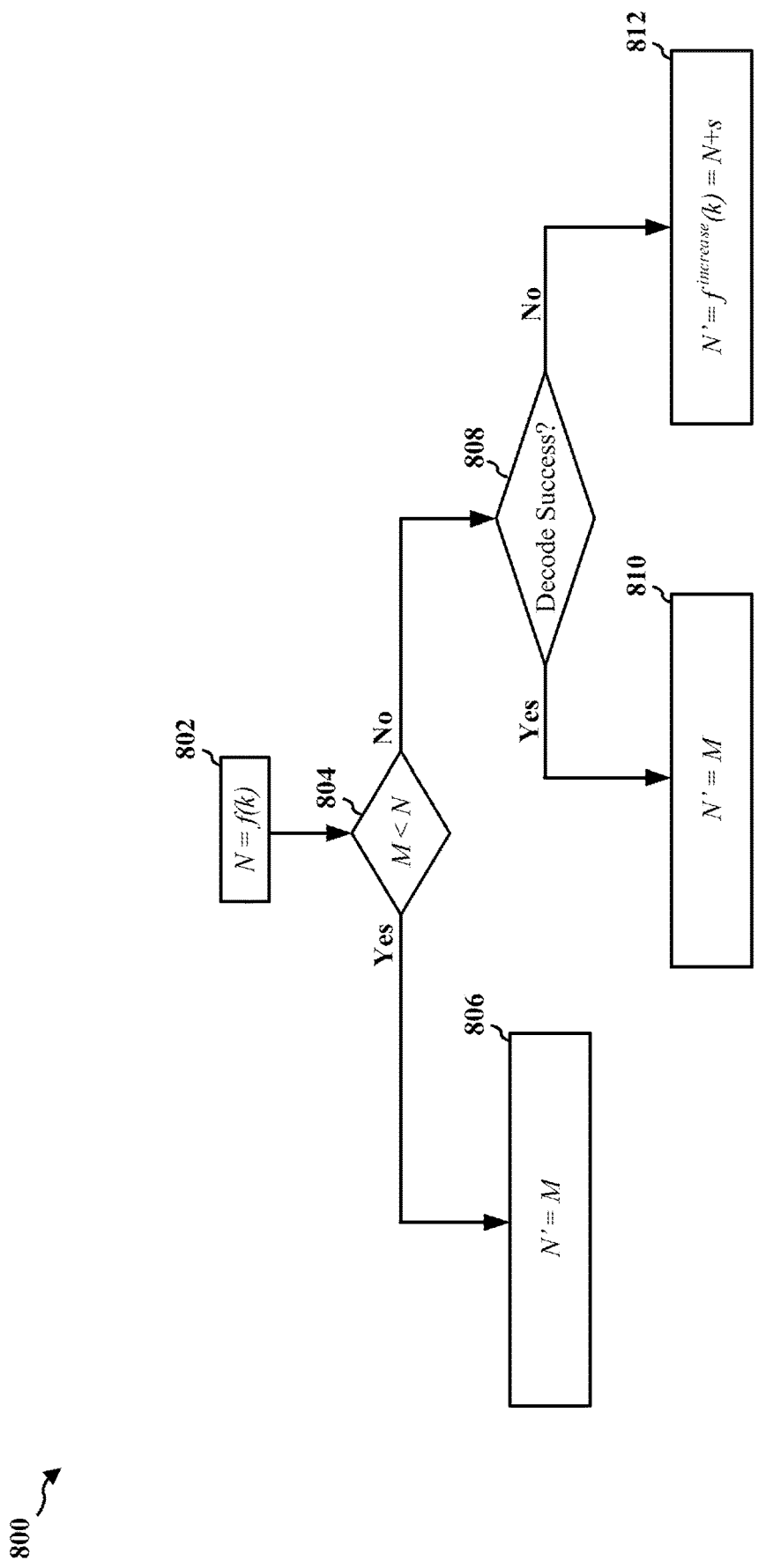
FIG. 8 is a flowchart illustrating further example operations for adapting a coding rate at which to encode data packets based on a quantity of encoded packets used to recover other data packets.

FIG. 8 is a flowchart 800 illustrating further example operations for adapting a coding rate at which to encode data packets based on a quantity of encoded packets used to recover other data packets. The example operations may be performed at a transmitting side when transmitting packets according to NC. For example, the illustrated operations may be performed by the transmitter 402 of FIG. 4 and/or the transmitter 502 of FIG. 5. In some aspects, the illustrated operations may be performed by a base station, such as the base station 102/180 of FIG. 1 or the base station 310 of FIG. 3. In some other aspects, the illustrated operations may be performed by a UE, such as the UE 104 of FIG. 1 or the UE 350 of FIG. 3.

At 802, the transmitter determines N, the number of encoded packets to transmit for a first packet, based on a NC function ƒ(k). For example, the NC function ƒ(k) may be Equation 1, described above. The transmitter generates the N encoded packets and transmits the N encoded packets to a receiver. Subsequently, the transmitter determines M, the number of encoded packets used by the receiver to determine the first packet, if the receiver successfully decoded the first packet. The transmitter may determine M based on feedback from the receiver, as described above. Upon determining M (or determining that M does not exist because the receiver failed to decode the first packet), the transmitter may determine N', the number of encoded packets to transmit for a second packet subsequent to the first packet.

At 804, the transmitter determines if M is less than N. If so, at 806, the transmitter may determine N' to be equal to M. The transmitter may set N' directly to M, without determining N' based on a NC function.

At 804, if the transmitter determines that M is not less than N, the transmitter determines at 808 if the first packet was decoded successfully. If so, at 810, the transmitter may determine N' to be M directly, without determining N' based on a NC function. If the transmitter determines at 808 that the first packet was not decoded successfully, at 812, the transmitter may determine N' to be N+s, where s is a set increase value. N+s may be determined directly or based on a NC function $f_{increase}(k)$. By avoiding calculating N' based on NC functions, the transmitter may reduce computation resources required to determine N'.

Figure 9:
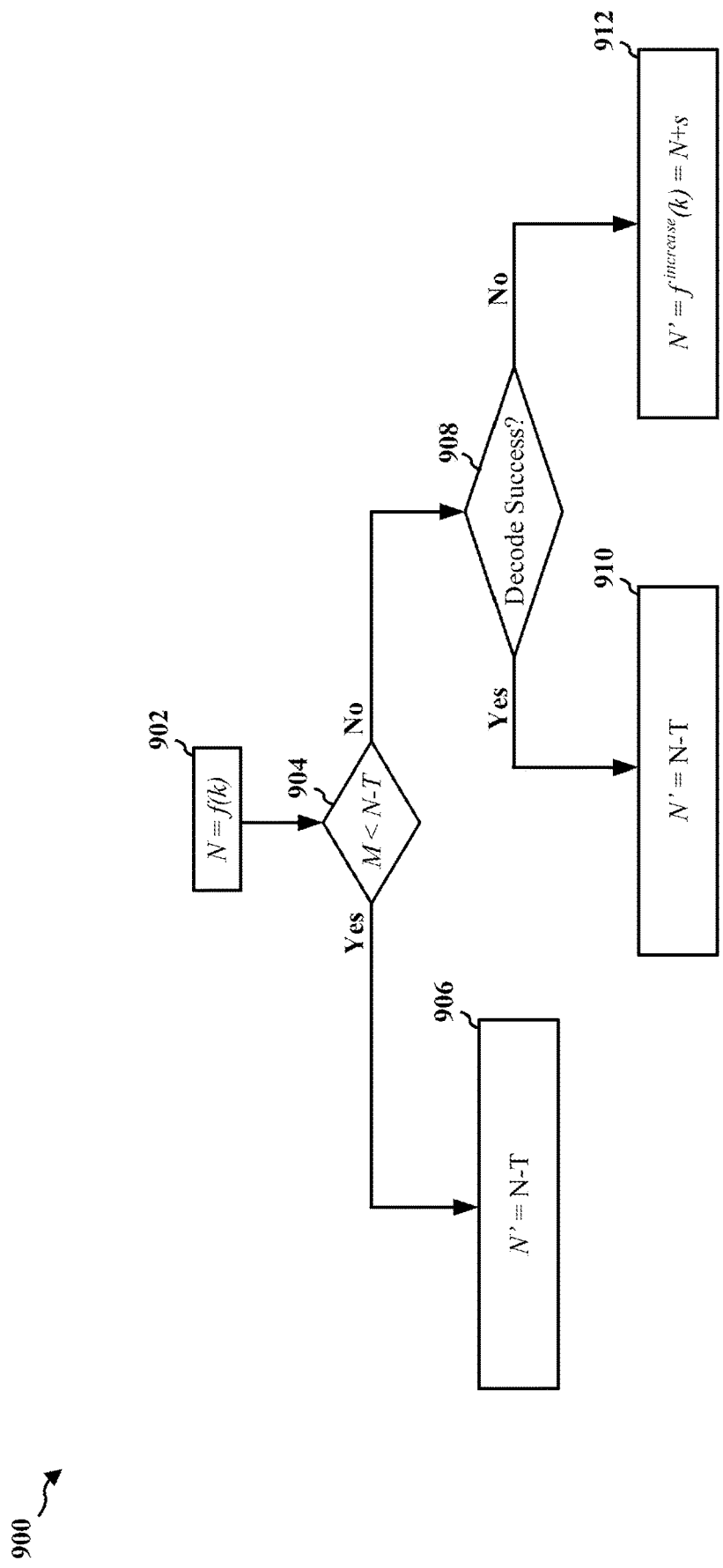
FIG. 9 is a flowchart illustrating still other example operations for adapting a coding rate at which to encode data packets based on a quantity of encoded packets used to recover other data packets.

FIG. 9 is a flowchart 900 illustrating still other example operations for adapting a coding rate at which to encode data packets based on a quantity of encoded packets used to recover other data packets. The example operations may be performed at a transmitting side when transmitting packets according to NC. For example, the illustrated operations may be performed by the transmitter 402 of FIG. 4 and/or the transmitter 502 of FIG. 5. In some aspects, the illustrated operations may be performed by a base station, such as the base station 102/180 of FIG. 1 or the base station 310 of FIG. 3. In some other aspects, the illustrated operations may be performed by a UE, such as the UE 104 of FIG. 1 or the UE 350 of FIG. 3.

At 902, the transmitter determines N, the number of encoded packets to transmit for a first packet, based on a NC function ƒ(k). For example, the NC function ƒ(k) may be Equation 1, described above. The transmitter generates the N encoded packets and transmits the N encoded packets to a receiver. Subsequently, the transmitter determines M, the number of encoded packets used by the receiver to determine the first packet, if the receiver successfully decoded the first packet. The transmitter may determine M based on feedback from the receiver, as described above. Upon determining M (or determining that M does not exist because the receiver failed to decode the first packet), the transmitter may determine N', the number of encoded packets to transmit for a second packet subsequent to the first packet.

At 904, the transmitter determines if M is less than N. If so, at 906, the transmitter may determine N' to be equal to M. The transmitter may set N' directly to M, without determining N' based on a NC function.

At 904, if the transmitter determines that M is not less than N, the transmitter determines at 908 if the first packet was decoded successfully. If so, at 910, the transmitter may determine N' to be M directly, without determining N' based on a NC function. If the transmitter determines at 908 that the first packet was not decoded successfully, at 912, the transmitter may determine N' to be N+s, where s is a set increase value. N+s may be determined directly or based on a NC function $f_{increase}(k)$. By avoiding calculating N' based on NC functions, the transmitter may reduce computation resources required to determine N'.

Figure 10:
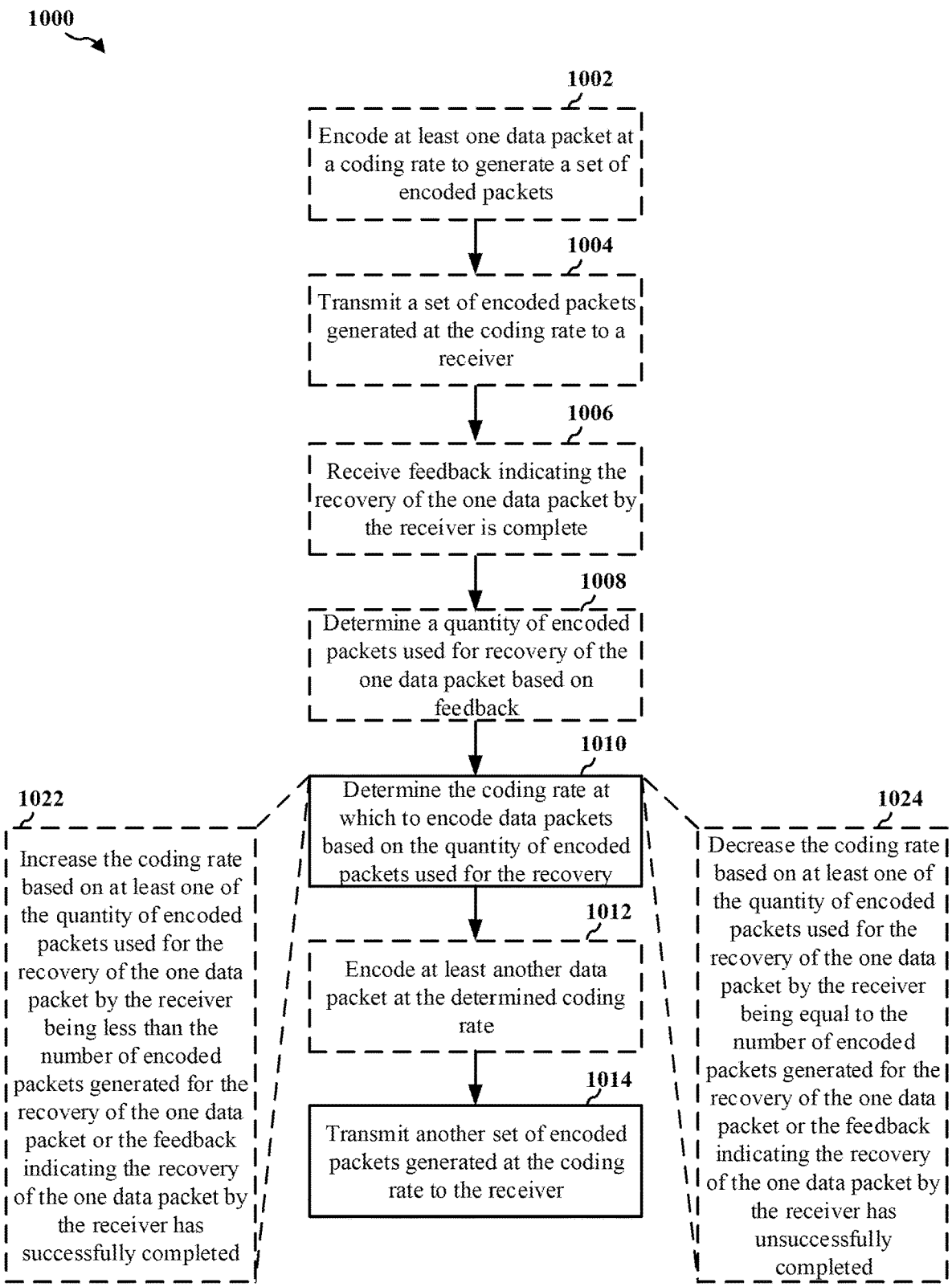
FIG. 10 is a flowchart illustrating an example of a method for adapting a coding rate at which to encode data packets based on a quantity of encoded packets used to recover other data packets.

FIG. 10 is a flowchart 1000 illustrating an example of a method for adapting a coding rate at which to encode data packets based on a quantity of encoded packets used to recover other data packets. The method may be practiced or performed at a transmitting side when transmitting packets according to NC. For example, the illustrated operations may be performed by the transmitter 402 of FIG. 4 and/or the transmitter 502 of FIG. 5. In some aspects, the illustrated operations may be performed by a base station, such as the base station 102/180 of FIG. 1 or the base station 310 of FIG. 3, or may be performed by an apparatus, such as the apparatus 1502 shown at FIG. 15. In some other aspects, the illustrated operations may be performed by a UE, such as the UE 104 of FIG. 1 or the UE 350 of FIG. 3, or may be performed by another apparatus, such as the apparatus 1402 of FIG. 14.

At 1002, the transmitter may encode at least one data packet at a coding rate to generate a set of encoded packets. For example, first, the transmitter may divide one data packet into a number K of subpackets, which may be uncoded, and second, the transmitter may generate a number N of encoded packets from the K subpackets. The transmitter may generate the N encoded packets from encoding the one data packet at a coding rate, which may include encoding some redundancy from the original data packet into some or all of the N encoded packets.

For example, referring to FIG. 4, the transmitter 402 may divide 412 a first packet into K subpackets, and then the transmitter 402 may generate 414 N encoded packets from the K subpackets. Referring to FIG. 5, the transmitter 502 (e.g., at the NC layer 513) may encode the data packet 542 by dividing the data packet 542 into K uncoded subpackets 544 and encoding the K uncoded subpackets 544 into N encoded packets 546.

At 1004, the transmitter may transmit a set of encoded packets generated at the coding rate to a receiver. For example, the coding rate may be configured so that the ratio of subpackets is k:n, and so for all approximately equally sized data packets divided into K subpackets, N encoded packets may be generated when a data packet is encoded at the coding rate.

For example, referring to FIG. 4, the transmitter 402 may transmit N encoded packets 422 to the receiver 404. Referring to FIG. 5, the transmitter 502 may transmit, to the receiver 504, the N encoded packets 546, which may have been encoded at the NC layer 513.

At 1006, the transmitter may receive feedback indicating the recovery of the one data packet is complete. For example, the feedback may indicate that the receiver has successfully recovered the one data packet, such as where the receiver is able to recover the original data of the one data packet to a satisfactory degree, and the recovered one data packet is suitable to be passed up the protocol stack. Conversely, the feedback indicating the recovery of the one data packet is complete may indicate that the receiver was unsuccessful in recovering the one data packet. For example, the receiver may fail to receive a quantity of the encoded packets of the set of encoded packets carrying that is sufficient to recover from the quantity of bit erasures with which those encoded packets were received. In some aspects, information indicating whether recovery of a data packet has successfully completed or has unsuccessfully completed may be carried included in an RLC status report, a PDCP status report, and/or a report from another layer.

In some aspects, the feedback may indicate a quantity of encoded packets from the transmitted set of encoded packets that the receiver used for recovery of the one data packet, and potentially, regardless of whether that recovery was successful or was unsuccessful. For example, the feedback may include an RLC status report, a PDCP status report, and/or a report from another layer having a field in which the receiver sets a value to indicate a number corresponding the quantity of encoded packets used to recovery the at least one data packet.

In some other aspects, the feedback may indicate a reception status, such as ACK feedback and/or NACK feedback responsive to recovery of one data packet and/or responsive to the encoded packets used for recovery of the one data packet. ACK and/or NACK feedback may include HARQ feedback at the MAC layer, ARQ feedback at the RLC layer, or other feedback at another layer.

For example, referring to FIG. 4, the transmitter 402 may receive feedback 426 indicating the recovery of the first data packet is complete, and the feedback 426 may indicate whether the receiver 404 was successful in recovering the original data of the first data packet. Referring to FIG. 5, the transmitter 502 may receive (e.g., at the NC layer 513) the feedback 508 that indicates whether recovery by the receiver 504 of the data packet 542 from the transmitted set of encoded packets 546 was successful.

At 1008, the transmitter may determine a quantity of encoded packets associated with recovery of the one data packet based on the feedback. The feedback may indicate the quantity of encoded packets that are associated with recovery of the one data packet by the receiver. In some aspects, the quantity of encoded packets used in the recovery of the one data packet may be explicitly signaled by the receiver, e.g., in a field of a report, such as a field of an RLC status report, PDCP status report, or other similar report. Accordingly, the transmitter may identify the field having a value or other information that directly indicates the quantity of the encoded packets used for recovery of the one data packet, and then the transmitter may determine that the quantity of encoded packets used for recovery of the one data packets is equal to the value or other information in that reporting field.

In some other aspects, the transmitter may determine the quantity of encoded packets associated with recovery of the one data packet based on a respective receive status indicator (e.g., ACK feedback) in the feedback that corresponds to each of the encoded packets used for recovery of the one data packet. For example, first, the transmitter may identify a subset of a set of receive status indicators indicating that the encoded packet to which the receive status indicator corresponds was successfully received, and so presumably was used for data packet recovery (at least in instances in which data packet recovery was unsuccessfully). The transmitter may determine a count of the subset of receive status indicators, such as using by counting each HARQ or ARQ ACK indication corresponding to one data packet. The transmitter may begin counting receive status indicators with the next consecutive status indicator received after feedback indicating the packet immediately preceding the one packet being recovered as an example point. The transmitter may cease counting receiver status indicators for the one data packet at a point at which the feedback indicates that recovery of the one data packet has been successfully or unsuccessfully recovered. Various information may be included in the feedback, either indicating or from which can be derived, the encoded packets that correspond to the one data packet.

For example, referring to FIG. 4, the transmitter 402 may determine 428 a quantity of encoded packets associated with recovery of the one data packet based on the feedback 426 indicating the recovery of the first data packet is complete. Referring to FIG. 5, the transmitter 502 may determine (e.g., at the NC layer 513), based on the feedback 508 from the receiver 504, a quantity of encoded packets 546 associated with recovery of the one data packet 542.

At 1010, the transmitter may determine the coding rate at which to encode packets based on the quantity of encoded packets used for the recovery. For example, first, the transmitter may compare the number of encoded packets N generated by encoding one data packet to the quantity of encoded packets used for the recovery of the one data packet at the receiver, and second, the transmitter may determine whether the number of encoded packets N is greater than or equal to the quantity of encoded packets used for recovery by the receiver based on the comparison (n.b., the number N cannot be less than, as the receiver cannot use a greater quantity of encoded packets than that transmitted to the receiver).

In some aspects, the transmitter may adjust the coding rate, such as by increasing and/or decreasing, the coding rate along a fixed scale (e.g., a fixed scale having evenly spaced intervals). When the transmitter determines to increase the coding rate, the transmitter may move to a higher coding rate along the scale (e.g., the next highest interval) and/or the transmitter may configure an encoding function to reduce the number n of encoded packets generated from encoding a data packet by a fixed amount. For example, the transmitter may decrease the quantity of encoded packets generated by encoding each data packet by subtracting a first step value x so that the n will be set to n−x.

Similarly, when the transmitter determines to decrease the coding rate, the transmitter may move to the next lowest coding rate interval along the scale and/or the transmitter may configure an encoding function to increase the number n of encoded packets generated from encoding a data packet by a fixed amount. For example, the transmitter may increase the quantity of encoded packets generated by encoding each data packet by adding a second step value y so that the n will be set to n+y. The first and the second step values may be equal (e.g., x=y).

In some further aspects, the transmitter may determine that the coding rate should remain unchanged, and so the transmitter may maintain the current coding rate. For example, when the feedback indicates the quantity of encoded packets used by the receiver for recovery of a data packet is equal to or within a threshold amount of the number N of encoded packets generated by encoding a data packet, and the feedback further indicates that all or a sufficient amount of data packets are recovered from the encoded packets, then the transmitter may determine that the current coding rate is suitable for the wireless channel between the transmitter and the receiver. Therefore, the transmitter may maintain the coding rate at a current level.

For example, referring to FIG. 4, the transmitter 402 may determine the coding rate at which to encode the second packet such that N' encoded packets 442 are generated based on the quantity of encoded packets used for the recovery of the first packet. Referring to FIG. 5, the transmitter 502 may determine (e.g., at the NC layer 513), based on the quantity of encoded packets 546 used for recovery of the data packet 542, a coding rate at which to encode other data packets.

In some aspects, to determine the coding rate (at 1010), at 1022, the transmitter may increase the coding rate at which to encode data packets based on at least one of: (1) the quantity of encoded packets used by the receiver for recovery of the one data packet being less than the number of encoded packets generated from encoding one data packet at the coding rate prior to increase; and/or (2) the feedback indicating the recovery of at least one data packet by the receiver has successfully completed. By increasing the coding rate, the number N of encoded packets that is generated from one data packet may be decreased. In other words, the number N of encoded packets generated from one data packet may be decreased, as less redundancy may be necessary for data protection on the channel between the transmitter and the receiver. The inverse relationship between the number N of encoded packets and the coding rate results from the effect of the coding rate on the ratio of one data packet to n encoded packets.

For example, referring to FIG. 4, the transmitter 402 may increase the coding rate at which to encode data packets, and so the number N of encoded packets 422 may be greater than the number N' of encoded packets 442. Referring to FIG. 5, the transmitter 502 (e.g., at the NC layer 513) may increase the coding rate at which to encode data packets, and so the number of encoded packets 546 may be greater than the number of the next set of encoded packets generated after the coding rate is increased.

In some other aspects, to determine the coding rate (at 1010), at 1024, the transmitter may decrease the coding rate at which to encode data packets based on at least one of: (1) the quantity of encoded packets used by the receiver for recovery of the one data packet being equal to (or slightly less than, such as by a threshold amount) the number of encoded packets generated from encoding one data packet at the coding rate prior to increase; and/or (2) the feedback indicating the recovery of at least one data packet has unsuccessfully completed (e.g., the data packet could not be recovered due to erasures). By decreasing the coding rate, the number N of encoded packets that is generated from one data packet may be increased. In other words, the number N of encoded packets generated from one data packet may be increased, as more redundancy may be necessary for data protection on the channel between the transmitter and the receiver.

For example, referring to FIG. 4, the transmitter 402 may decrease the coding rate at which to encode data packets, and so the number N of encoded packets 422 may be less than the number N' of encoded packets 442. Referring to FIG. 5, the transmitter 502 (e.g., at the NC layer 513) may decrease the coding rate at which to encode data packets, and so the number of encoded packets 546 may be less than the number of the next set of encoded packets generated after the coding rate is increased.

At 1012, the transmitter may encode at least another data packet at the determined coding rate to generate the other set of encoded packets. For example, first, the transmitter may divide the other data packet into a number of subpackets, which may be uncoded, and second, the transmitter may generate a number N' of encoded packets from the subpackets. The transmitter may generate the N' encoded packets from encoding the one data packet at the determined coding rate, which may include an adjusted amount of redundancy. The transmitter may encode the at least one other data packet using an NC function, and the transmitter may set at least one input variable affecting the coding rate, which may determine the code rate. The NC function, for example, may encode the at least one other data packet using a fountain code or other rateless code, such as an LT code or a Raptor code. The transmitter may provide the at least one other data packet to the NC function, and the transmitter may obtain a set of N' encoded packets as an output of the NC function.

For example, referring to FIG. 4, the transmitter 402 may divide 432 a second packet into K subpackets, and then the transmitter 402 may generate 434 N' encoded packets from the K subpackets. Referring to FIG. 5, the transmitter 502 (e.g., at the NC layer 513) may encode another data packet, similar to the data packet 542, by dividing the other data packet into a set of uncoded subpackets and encoding the uncoded subpackets into N' encoded packets.

At 1014, the transmitter may transmit another set of encoded packets generated at the determined coding rate to a receiver. The determined coding rate may allow the receiver to recover the other data packet from the other set of encoded packets, e.g., given the conditions on the wireless channel between the transmitter and the receiver.

For example, referring to FIG. 4, the transmitter 402 may transmit N' encoded packets 442 to the receiver 404. Referring to FIG. 5, the transmitter 502 may transmit, to the receiver 504, the N' encoded packets, which may have been encoded at the NC layer 513.

Figure 11:
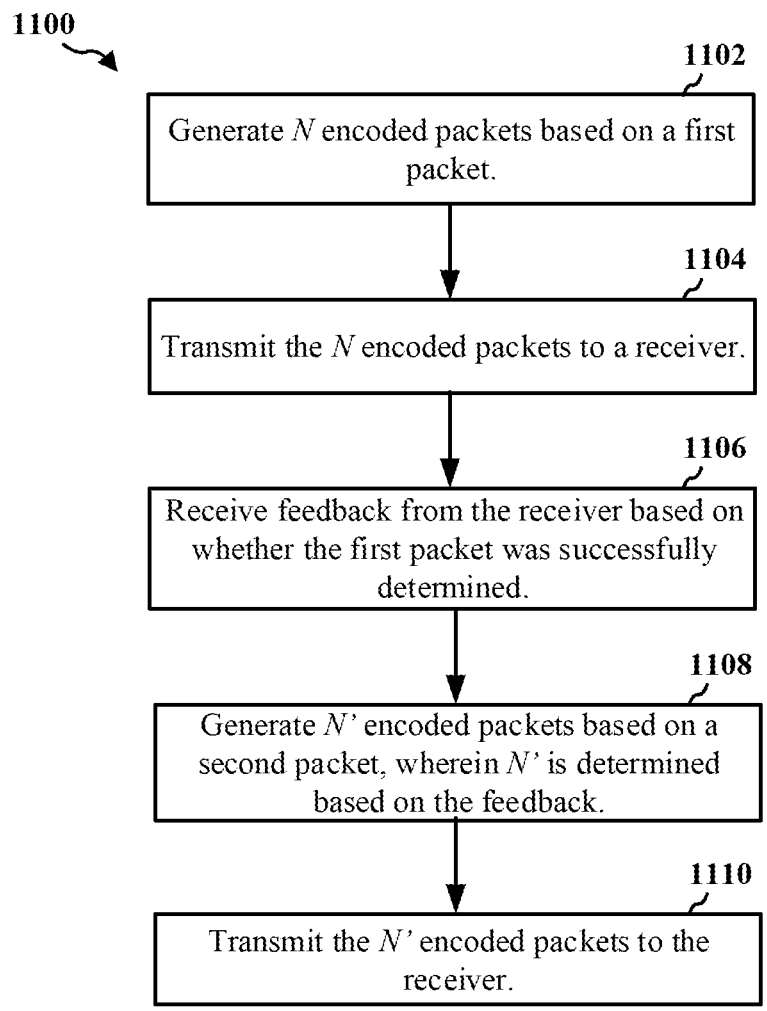
FIG. 11 is a flowchart illustrating another example of a method for adapting a coding rate at which to encode data packets based on a quantity of encoded packets used to recover other data packets.

FIG. 11 is a flowchart 1100 illustrating another example of a method for adapting a coding rate at which to encode data packets based on a quantity of encoded packets used to recover other data packets. The method may be practiced or performed at a transmitting side when transmitting packets according to NC. For example, the illustrated operations may be performed by the transmitter 402 of FIG. 4 and/or the transmitter 502 of FIG. 5. In some aspects, the illustrated operations may be performed by a base station, such as the base station 102/180 of FIG. 1 or the base station 310 of FIG. 3, or may be performed by an apparatus, such as the apparatus 1502 shown at FIG. 15. In some other aspects, the illustrated operations may be performed by a UE, such as the UE 104 of FIG. 1 or the UE 350 of FIG. 3, or may be performed by another apparatus, such as the apparatus 1402 of FIG. 14.

At 1102, the transmitter may generate N encoded packets based on a first packet. N may be an integer greater than zero. The N encoded packets may be generated based on the first packet using a NC algorithm. The NC algorithm may be, for example, an LT code or a Raptor code.

At 1104, the transmitter may transmit the N encoded packets to a receiver.

At 1106, the transmitter may receive feedback from the receiver, the feedback being based on whether the first packet was successfully determined by the receiver based on the N encoded packets. The feedback may identify a number of encoded packets used by the receiver to determine the first packet. The feedback may indicate that the receiver did not successfully determine the first packet.

In some aspects, the feedback may include a packet data convergence protocol status report or a radio link control status report. The packet data convergence protocol status report or the radio link control status report may include a value identifying the number of encoded packets used by the receiver to determine the first packet. In some aspects, the feedback may include acknowledgements for the N encoded packets. The acknowledgements may be radio link control status report acknowledgements or media access control acknowledgements.

At 1108, the transmitter may generate N' encoded packets based on a second packet, wherein N' an integer greater than zero and wherein N' is determined based on the feedback. The N' encoded packets may be generated based on the first packet using a NC algorithm. The NC algorithm may be, for example, an LT code or a Raptor code.

The number of encoded packets used by the receiver to determine the first packet may be less than N, and N' may be determined by reducing N by a first step size value. The number of encoded packets used by the receiver to determine the first packet may be less than N, and N' may be determined to be equal to the number of encoded packets used by the receiver to determine the first packet. The number of encoded packets used by the receiver to determine the first packet may be less than N minus a threshold value, and N' may be determined to be the higher of N minus the threshold value and N minus a first step size value. The number of encoded packets used by the receiver to determine the first packet may be less than N minus a threshold value, and N' may be determined by reducing N by the threshold value.

The feedback may indicate that the receiver did not successfully determine the first packet, and N' may be determined by increasing N by a second step size value.

The number of encoded packets used by the receiver to determine the first packet may be equal to N, and N' may be determined to be N. The number of encoded packets used by the receiver to determine the first packet may be greater than N minus a threshold value, and N' may be determined to be N.

In some aspects, where the feedback may include acknowledgements for the N encoded packets, the transmitter may count the received acknowledgements, may receive a confirmation from the receiver indicating that the receiver has successfully determined the first packet, and may determine a number of encoded packets used by the receiver to determine the first packet based on a number of acknowledgements counted upon receiving the confirmation.

At 1110, the transmitter may transmit the N' encoded packets to the receiver.

Figure 12:
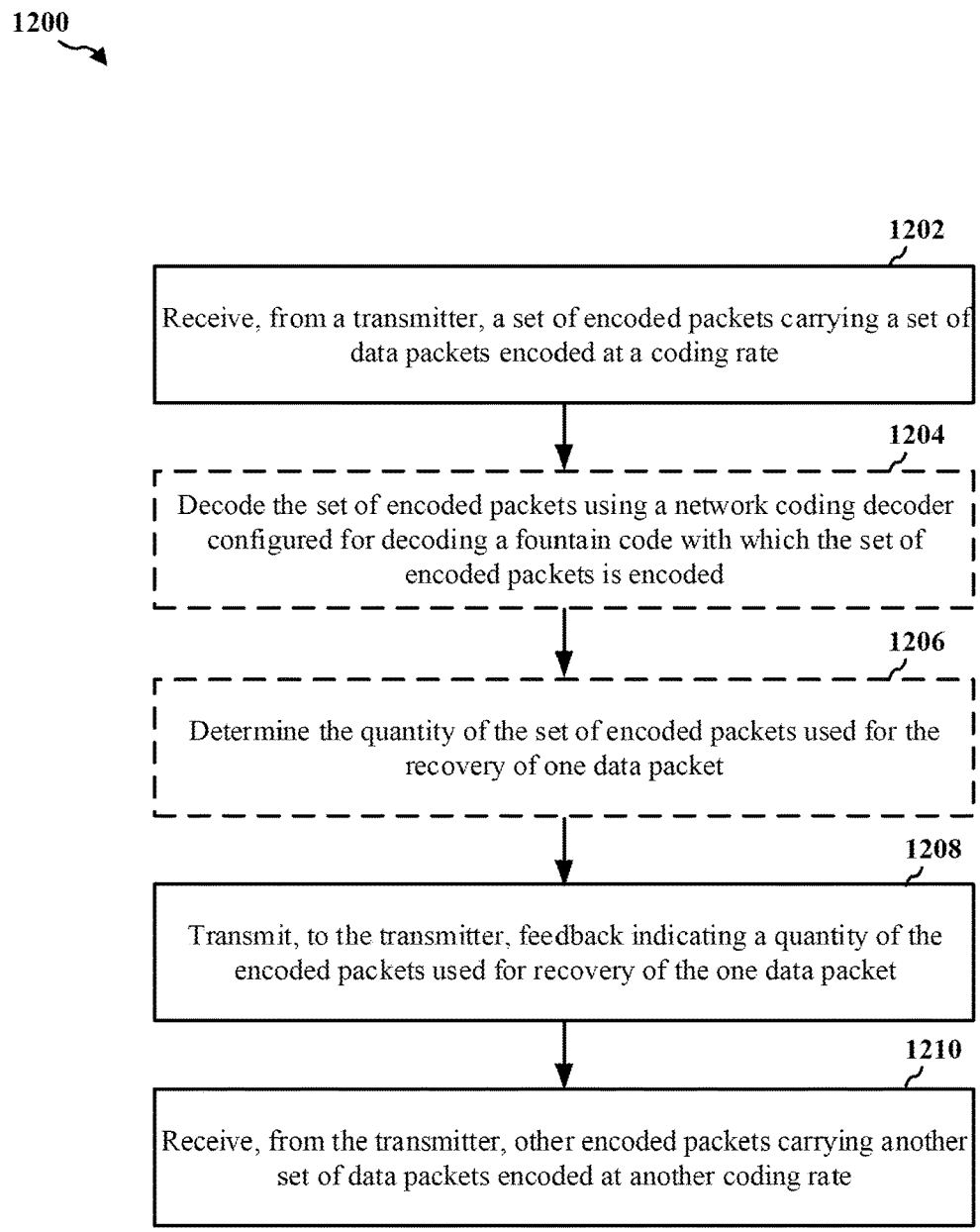
FIG. 12 is a flowchart illustrating an example of a method for providing feedback indicative of a quantity of encoded packets used in recovery of data, which may be used to adapt a coding rate at which to encode data packets.

FIG. 12 is a flowchart 1200 illustrating an example of a method for providing feedback indicative of a quantity of encoded packets used in recovery of data, which may be used to adapt a coding rate at which to encode data packets. The method of FIG. 12 may be practiced or performed at a receiving side when receiving packets according to NC. For example, the illustrated operations may be performed by the receiver 404 of FIG. 4 and/or the receiver 504 of FIG. 5. In some aspects, the illustrated operations may be performed by a UE, such as the UE 104 of FIG. 1 or the UE 350 of FIG. 3, or may be performed by another apparatus, such as the apparatus 1402 of FIG. 14. In some other aspects, the illustrated operations may be performed by a base station, such as the base station 102/180 of FIG. 1 or the base station 310 of FIG. 3, or may be performed by an apparatus, such as the apparatus 1502 shown at FIG. 15.

At 1202, the receiver may receive, from the transmitter, a set of encoded packets carrying a set of data packets encoded at a coding rate. For example, the receiver may receive N data packets into which one data packet is encoded, such as encoded with redundancy using a fountain code.

For example, referring to FIG. 4, the receiver 404 may receive N encoded packets 422 from the transmitter 402. Referring to FIG. 5, the receiver 504 may receive (e.g., at the NC layer 523), from the transmitter 502, the N encoded packets 546, which may have been generated by the transmitter 502 based on encoding a data packet at a coding rate.

At 1204, the receiver may decode the set of encoded packets for recovery of at least one data packet carried therein. The set of encoded packets may carry the set of original data packets therein, although encoded with redundancy—e.g., the coding rate may indicate a number of encoded packets into which an individual packet is encoded. The receiver may decode the encoded packets to obtain the contents (e.g., data) of an original packet. The receiver may recover from erasures or missed bits in the content using the redundancy encoded into the encoded packets. The receiver may reconstruct the at least one original packet carried in the set of encoded packets. In some aspects, the receiver may use an NC decoder that is configured for decoding a fountain code with which the at least one data packet carried in the encoded packets is encoded. For each data packet, the receiver may determine whether the data packet is successfully recovered, such as by evaluating the data packet with an integrity check function or an error detection function. If recovery of the one data packet is successfully completed, then the recovered data packet may be passed to a higher layer(s). However, if recovery of the one data packet is unsuccessfully completed, then transfer of the one data packet may be suppressed so that the one data packet is not passed to a higher layer(s) of the protocol stack.

For example, referring to FIG. 4, the receiver 404 may decode 424 the set of N encoded packets 422 from the transmitter 402. Referring to FIG. 5, the receiver 504 may decode (e.g., at the NC layer 523) the N encoded packets 546, which may have been generated by the transmitter 502 based on encoding a data packet at a coding rate.

At 1206, the receiver may determine a quantity of encoded packets used for recovery of the one data packet. For example, the receiver may recover a first subpacket $K_1$ from a first encoded packet and a second subpacket $K_2$ from a second encoded packet of the set of encoded packets; however, both subpackets may include some erasures, which may prevent the full original data packet from being recovered. The receiver may also recover a third subpacket $K_3$ that includes some redundant information from the first and second subpackets at the positions of the erasures, and so the receiver may recover the portions of the original data packet that correspond to erasures in the encoded packets. The receiver may determine the number of encoded packets used in recovering one data packet, and potentially, regardless of whether that recovery was successfully or unsuccessfully completed. After recovery of the original data packet is complete, such as when the original data packet passes or fails a data integrity or other error check, the receiver may calculate the sum of the encoded packets from which some data was used for recovery of the original data (e.g., regardless of whether that data was redundant, used to correct erasures, etc.). The sum may be the number of encoded packets from which data was retrieved for one data packet.

However, the receiver may determine that the recovery was unsuccessfully completed, and in such instances, the receiver may determine that the quantity of encoded packets used for recovery of the one data packet may be equal to either (1) the sum of every encoded packet that is received and determined to carry some data of the one data packet; or (2) zero, which may indicate that the recovery of the one data packet has been unsuccessfully completed. For example, if too many erasures or errors occur in the data packets, then a data packet may be unrecoverable and the recovery process may be unsuccessfully completed. The receiver may detect an unrecoverable packet when the estimated original data is evaluated, e.g., using a data integrity function and/or an error detection function. For example, the recovered data packet may be evaluated using CRC or another Hash function, and if the receiver determines that this function fails then the receiver may determine that the recovery of the one data packet has unsuccessfully completed.

For example, referring to FIG. 4, the receiver 404 may determine a quantity of the encoded packets 422 associated with recovery of the first data packet. Referring to FIG. 5, the receiver 504 may determine (e.g., at the NC layer 523), a quantity of the encoded packets 546 used for recovery of the data packet 542.

At 1208, the receiver may transmit, to the transmitter, feedback indicating a quantity of encoded packets used for recovery of the one data packet. In some aspects, the receiver may explicitly signal this quantity of encoded packets, e.g., in a field of a report, such as a field of an RLC status report, PDCP status report, or other similar report. In some other aspects, however, the receiver may be unaware of or agnostic to the quantity of encoded packets used for data packet recovery. Instead, the receiver may transmit feedback including a respective receive status indicator (e.g., ACK feedback) that corresponds to each of the encoded packets used for recovery of the one data packet. As the receiver may also indicate that recovery for a data packet has completed, the receive status indicators corresponding to the period between two indications of data packet recovery completion may be used to determine the number of encoded packets used in recovery of the one data packet.

For example, referring to FIG. 4, the receiver 404 may transmit, to the transmitter, feedback indicating a quantity of the encoded packets 422 used for recovery of the first data packet. Referring to FIG. 5, the receiver 504 may transmit (e.g., from the NC layer 523) the feedback 508 indicating the quantity of the encoded packets 546 used for recovery of the data packet 542.

At 1210, the receiver may receive, from the transmitter, another set of encoded packets carrying another set of data packets encoded at another coding rate. The other coding rate may be higher than the earlier coding rate, or the other coding rate may be lower than the earlier coding rate. In some other aspects, the other coding rate may be equal to the earlier coding rate. In some instances in which the receiver failed to recovery one or more data packets from the earlier received set of encoded packets, the receiver may recover a greater quantity of data packets from this other set of encoded packets, because a greater number of encoded packets may be received for each data packet.

For example, referring to FIG. 4, the receiver 404 may receive, from the transmitter 402, the N' encoded packets 442, which may carry the second data packet encoded at a different coding rate than the first data packet encoded into the N encoded packets 422. Referring to FIG. 5, the receiver 504 may receive (e.g., at the NC layer 523) another set of encoded packets from the transmitter 502, e.g., similar to the encoded packets 546, from which the receiver 504 may recover another data packet similar to the data packet 542.

Figure 13:
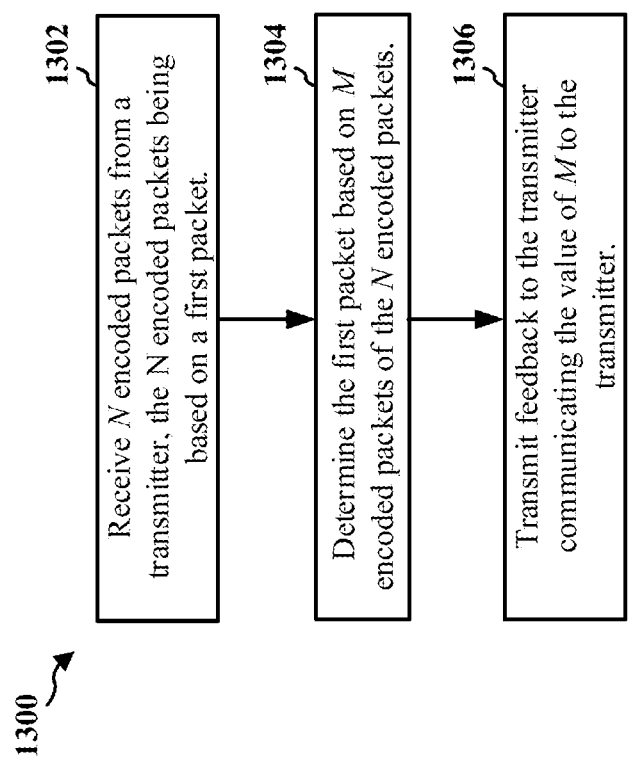
FIG. 13 is a flowchart illustrating another example of a method for providing feedback indicative of a quantity of encoded packets used in recovery of data, which may be used to adapt a coding rate at which to encode data packets.

FIG. 13 is a flowchart 1300 illustrating another example of a method for providing feedback indicative of a quantity of encoded packets used in recovery of data, which may be used to adapt a coding rate at which to encode data packets. The method of FIG. 12 may be practiced or performed at a receiving side when receiving packets according to NC. For example, the illustrated operations may be performed by the receiver 404 of FIG. 4 and/or the receiver 504 of FIG. 5. In some aspects, the illustrated operations may be performed by a UE, such as the UE 104 of FIG. 1 or the UE 350 of FIG. 3, or may be performed by another apparatus, such as the apparatus 1402 of FIG. 14. In some other aspects, the illustrated operations may be performed by a base station, such as the base station 102/180 of FIG. 1 or the base station 310 of FIG. 3, or may be performed by an apparatus, such as the apparatus 1502 shown at FIG. 15.

At 1302, the receiver may receive N encoded packets from a transmitter. The N encoded packets may be based on a first packet. N may be an integer greater than zero. The N encoded packets may be generated based on the first packet using a NC algorithm. The NC algorithm may be an LT code or a Raptor code.

At 1304, the receiver may determine the first packet based on M encoded packets of the N encoded packets. M may be an integer greater than zero and less than or equal to N.

At 1306, the receiver may transmit feedback to the transmitter. The feedback may communicate the value of M to the transmitter. In some aspects, the feedback may include a packet data convergence protocol status report or a radio link control status report, and the packet data convergence protocol status report or the radio link control status report may include a value corresponding to M. In some aspects, the feedback may include acknowledgements of the N encoded packets and/or a confirmation indicating when the first packet has been determined.

Transmitting feedback to the transmitter may include the receiver transmitting acknowledgements for received encoded packets of the N encoded packets and transmitting a confirmation to the transmitter upon determining the first packets from the M encoded packets. The acknowledgements may be radio link control status report acknowledgements or media access control acknowledgements.

Figure 14:
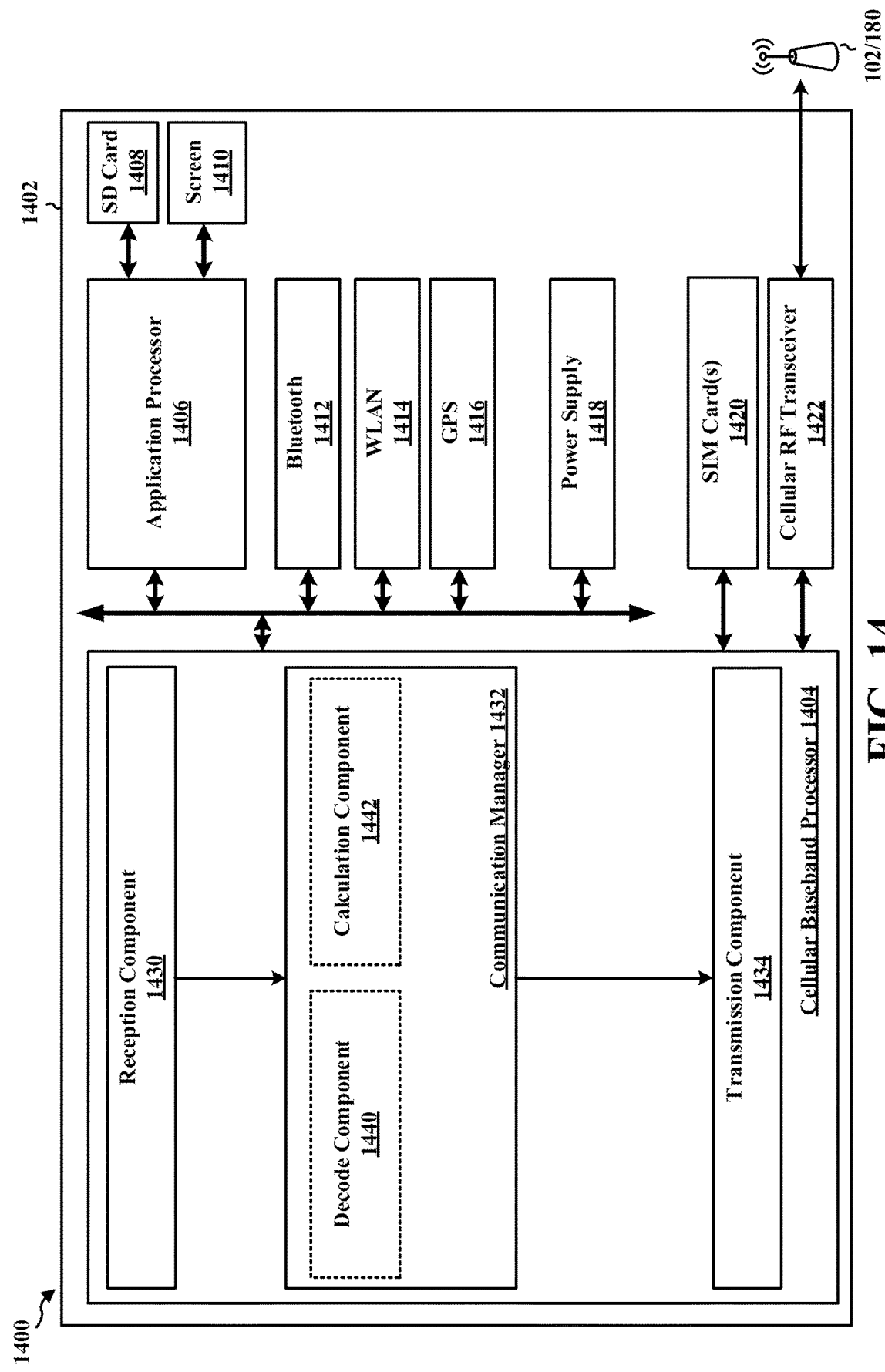
FIG. 14 is a diagram illustrating an example of a hardware implementation for an example apparatus.

FIG. 14 is a diagram 1400 illustrating an example of a hardware implementation for an apparatus 1402. The apparatus 1402 may be a UE, although the apparatus 1402 may be another device or a system in some other implementations. In some aspects, FIG. 14 may be a receiver during NC communication with a transmitter. Accordingly, FIG. 15 may illustrate a transmitter during NC communication with a receiver. In some other aspects, however, an apparatus, such as the apparatus 1402 and/or the apparatus 1502, may implement the functionality of both a receiver and a transmitter (e.g., on different links at different times).

In some aspects, the apparatus 1402 may include a cellular baseband processor 1404 (also referred to as a modem) coupled to a cellular RF transceiver 1422 and one or more subscriber identity modules (SIM) cards 1420, an application processor 1406 coupled to a secure digital (SD) card 1408 and a screen 1410, a Bluetooth module 1412, a wireless local area network (WLAN) module 1414, a Global Positioning System (GPS) module 1416, and/or a power supply 1418. The cellular baseband processor 1404 communicates through the cellular RF transceiver 1422 with the UE 104 and/or base station 102/180. The cellular baseband processor 1404 may include a computer-readable medium/ memory. The computer-readable medium/memory may be non-transitory. The cellular baseband processor 1404 is responsible for general processing, including the execution of software stored on the computer-readable medium/ memory. The software, when executed by the cellular baseband processor 1404, causes the cellular baseband processor 1404 to perform the various functions described supra. The computer-readable medium/memory may also be used for storing data that is manipulated by the cellular baseband processor 1404 when executing software. The cellular baseband processor 1404 further includes a reception component 1430, a communication manager 1432, and a transmission component 1434. The communication manager 1432 includes the one or more illustrated components. The components within the communication manager 1432 may be stored in the computer-readable medium/memory and/or configured as hardware within the cellular baseband processor 1404.

In the context of FIG. 3, the cellular baseband processor 1404 may be a component of the UE 350 and may include the memory 360 and/or at least one of the TX processor 368, the RX processor 356, and the controller/processor 359. In one configuration, the apparatus 1402 may be a modem chip and include just the baseband processor 1404, and in another configuration, the apparatus 1402 may be the entire UE (e.g., the UE 350 of FIG. 3) and include the aforediscussed additional modules of the apparatus 1402. In one configuration, the cellular RF transceiver 1422 may be implemented as at least one of the transmitter 354TX and/or the receiver 354RX.

The reception component 1430 may receive, from the transmitter base station 102/180, a set of encoded packets carrying a set of data packets encoded at a coding rate, e.g., as described in connection with 1202 of FIG. 12 and/or 1302 of FIG. 13.

The communication manager 1432 may include a decode component 1440 configured to decode the set of encoded packets for recovery of at least one data packet carried therein, e.g., as described in connection with 1204 of FIG. 12. For example, the decode component 1440 may be configured to determine a first packet based on M encoded packets of N encoded packets transmitted by the transmitter base station 102/180, e.g., as described in connection with 1304 of FIG. 13.

The communication manager 1432 may further include a calculation component 1442 configured to determine a quantity of encoded packets used for recovery of one data packet, e.g., as described in connection with 1206 of FIG. 12.

The transmission component 1434 may transmit, to the transmitter base station 102/180, feedback indicating a quantity of encoded packets used for recovery of the one data packet, e.g., as described in connection with 1208 of FIG. 12 and/or 1306 of FIG. 13.

The reception component 1430 may be further configured to receive, from the transmitter base station 102/180, another set of encoded packets carrying another set of data packets encoded at another coding rate, e.g., as described in connection with 1210 of FIG. 12.

The apparatus 1402 may include additional components that perform some or all of the blocks, operations, signaling, etc. of the algorithm(s) in the aforementioned call flow diagram and flowcharts of FIGS. 4 and 6-13. As such, some or all of the blocks, operations, signaling, etc. in the aforementioned call flow diagram and flowcharts of FIGS. 4 and 6-13 may be performed by a component and the apparatus 1402 may include one or more of those components. The components may be one or more hardware components specifically configured to carry out the stated processes/ algorithm, implemented by a processor configured to perform the stated processes/algorithm, stored within a computer-readable medium for implementation by a processor, or some combination thereof.

In one configuration, the apparatus 1402, and in particular the cellular baseband processor 1404, includes means for receiving, from a transmitter, encoded packets carrying a set of data packets encoded at a coding rate; means for transmitting, to the transmitter, feedback indicating a quantity of a set of the encoded packets used for recovery of one data packet of the set of data packets; and means for receiving, from the transmitter, other encoded packets carrying another set of data packets encoded at another coding rate.

In one configuration, the feedback includes the quantity of the set of encoded packets used for the recovery of the one data packet.

In one configuration, the apparatus 1402, and in particular the cellular baseband processor 1404, includes means for determining the quantity of the set of encoded packets used for the recovery of the one data packet.

In one configuration, the feedback includes a set of messages indicating a respective receive status for each of the set of the encoded packets.

In one configuration, the apparatus 1402, and in particular the cellular baseband processor 1404, includes means for decoding the set of encoded packets using a network coding decoder configured for decoding a fountain code with which the set of encoded packets is encoded, and the coding rate indicates a number of encoded packets into which an individual data packet is encoded.

In one configuration, the one data packet is passed from a lower layer of a protocol stack to an upper layer of the protocol stack when the decoding is successfully complete.

In one configuration, the one data packet is not passed from a lower layer of a protocol stack to an upper layer of the protocol stack when the decoding is unsuccessfully complete.

In one configuration, the decoding is unsuccessfully complete when at least one data integrity check associated with the one data packet is failed.

The aforementioned means may be one or more of the aforementioned components of the apparatus 1402 configured to perform the functions recited by the aforementioned means. As described supra, the apparatus 1402 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 15:
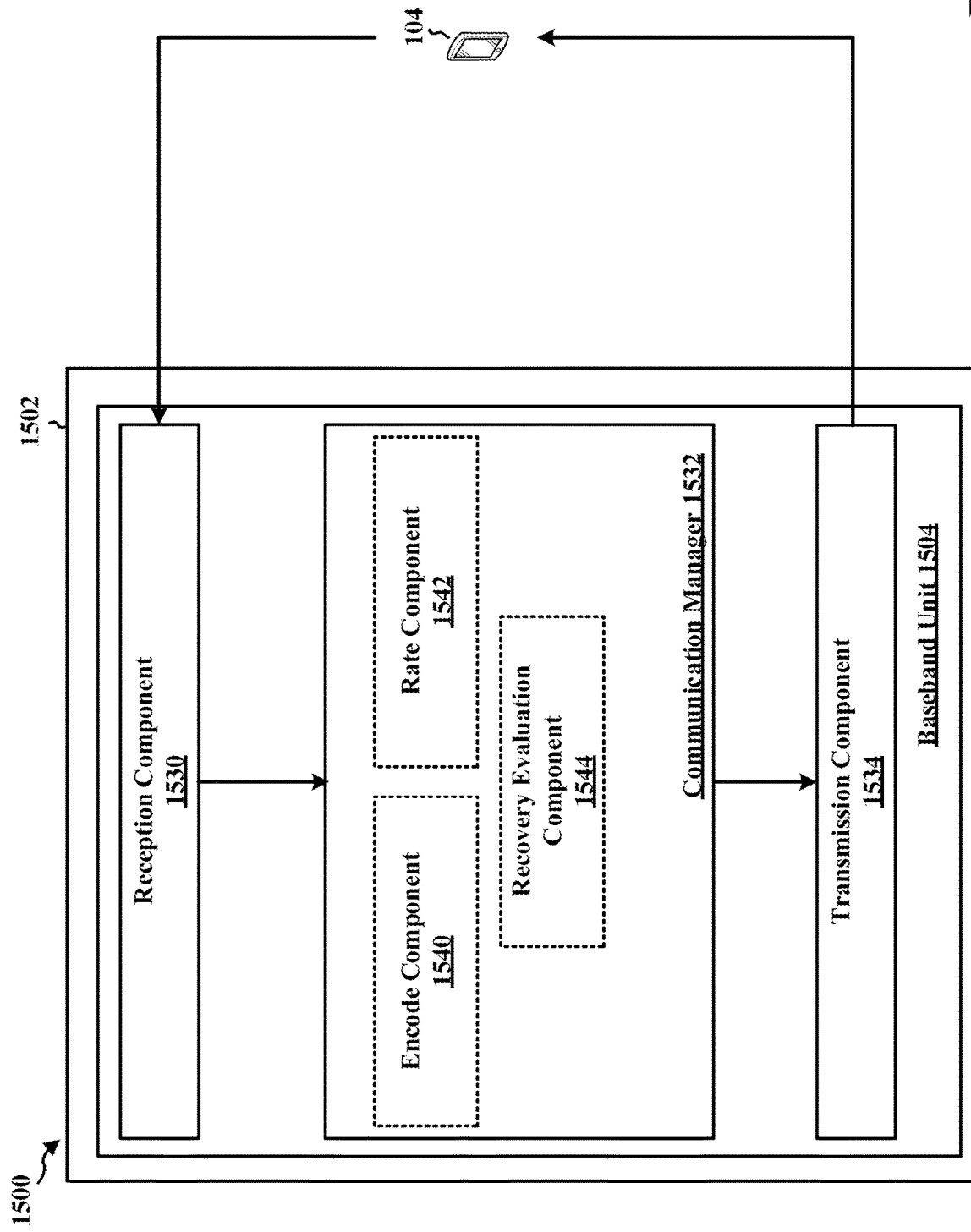
FIG. 15 is a diagram illustrating another example of a hardware implementation for another example apparatus.

FIG. 15 is a diagram 1500 illustrating an example of a hardware implementation for an apparatus 1502. The apparatus 1502 may be a base station; although the apparatus 1502 may be a UE or another apparatus in some other implementations. The apparatus 1502 may include a baseband unit 1504. The baseband unit 1504 may communicate through a cellular RF transceiver with the UE 104. The baseband unit 1504 may include a computer-readable medium/memory. The baseband unit 1504 is responsible for general processing, including the execution of software stored on the computer-readable medium/memory. The software, when executed by the baseband unit 1504, causes the baseband unit 1504 to perform the various functions described supra. The computer-readable medium/memory may also be used for storing data that is manipulated by the baseband unit 1504 when executing software. The baseband unit 1504 further includes a reception component 1530, a communication manager 1532, and a transmission component 1534. The communication manager 1532 includes the one or more illustrated components. The components within the communication manager 1532 may be stored in the computer-readable medium/memory and/or configured as hardware within the baseband unit 1504. The baseband unit 1504 may be a component of the base station 310 and may include the memory 376 and/or at least one of the TX processor 316, the RX processor 370, and the controller/processor 375.

The communication manager 1532 may include an encode component 1540 that is configured to encode a data packet at a coding rate to generate a set of encoded packets, e.g., as described in connection with 1002 of FIG. 10. For example, the encode component 1540 may generate N encoded packets based on a first packet, e.g., as described in connection with 1102 of FIG. 11.

The transmission component 1534 may be configured to transmit a set of encoded packets to a receiver UE 104, e.g., as described in connection with 1004 of FIG. 4 and/or 1104 of FIG. 11. The reception component 1530 may be further configured to receive feedback indicating the recovery of the one data packet is complete, e.g., as described in connection with 1006 of FIG. 10 and/or 1106 of FIG. 11. The feedback may indicate a number of received encoded packets, a number of recovered packets, receive status identifiers for packets, etc. For example, the feedback may expressly or impliedly indicate the quantity of encoded packets used to recover one data packet, or the feedback may include information from which the quantity of encoded packets used to recover one data packet can be derived.

The communication manager 1532 may further include a recovery evaluation component 1544, which may be configured to determine a quantity of encoded packets for recovery of one data packet based on the feedback, e.g., as described in connection with 1008 of FIG. 10.

The rate component 1542 that is configured to determine a code rate at which to encode data packets based on the quantity of encoded packets used for my own recovery, e.g., as described in connection with 1010 of FIG. 10.

In some aspects, the rate component 1542 may increase the coding rate based on at least one of the quantity of encoded packets used for the recovery of the one data packet by the receiver UE 104 being less than the number of encoded packets generated for the recovery of the one data packet or the feedback indicating the recovery of the one data packet by the receiver UE 104 has successfully completed. In some other aspects, the rate component 1542 may decrease the coding rate based on at least one of the quantity of encoded packets used for the recovery of the one data packet by the receiver UE 104 being equal to the number of encoded packets generated for the recovery of the one data packet or the feedback indicating the recovery of the one data packet by the receiver UE 104 has unsuccessfully completed.

In some aspects, the encode component 1540 may be further configured to encode at least another data packet at the determined coding rate, e.g., as described at 1012 of FIG. 10. For example, the encode component 1540 may generate N' encoded packets based on a second packet, with N' being based on the received feedback, e.g., as described in connection with 1108 of FIG. 11. The transmission component 1534 may be further configured to transmit another set of encoded packets to the receiver UE 104, e.g., as described at 1014 of FIG. 10 and/or 1110 of FIG. 11.

The apparatus 1502 may include additional components that perform some or all of the blocks, operations, signaling, etc. of the algorithm(s) in the aforementioned call flow diagram and flowcharts of FIGS. 4 and 6-13. As such, some or all of the blocks, operations, signaling, etc. in the aforementioned flowcharts of FIGS. 4 and 6-13 may be performed by a component and the apparatus 1502 may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1502, and in particular the baseband unit 1504, includes means for determining a coding rate at which to encode data packets based on a quantity of encoded packets used by a receiver for recovery of one data packet; and means for transmitting a set of encoded packets generated at the coding rate to the receiver.

In one configuration, the apparatus 1502, and in particular the baseband unit 1504, may further include means for transmitting another set of encoded packets generated at another coding rate to the receiver; and means for determining the quantity of encoded packets that are associated with the recovery of the one data packet based on feedback from the receiver for at least a subset of the other set of encoded packets.

In one configuration, the feedback indicates the quantity of encoded packets that are associated with the recovery of the one data packet by the receiver.

In one configuration, the feedback includes a set of messages indicating a respective receive status at the receiver for each of the at least the subset of the other set of encoded packets.

In one configuration, the apparatus 1502, and in particular the baseband unit 1504, may further include means for receiving information indicating the recovery of the one data packet by the receiver is complete, and the quantity of encoded data is determined based on the information indicating the recovery of the one data packet by the receiver is complete and a quantity of the receive statuses corresponding to a time period preceding the information indicating the recovery of the one data packet by the receiver is complete.

In one configuration, the apparatus 1502, and in particular the baseband unit 1504, may further include means for encoding another data packet at the coding rate using at least one network coding function to generate at least a subset of the set of encoded packets, and the network coding function includes a fountain code.

In one configuration, the means for determining the coding rate at which to encode data packets is configured to adjust the coding rate based on feedback from the receiver, and the quantity of encoded packets used for the recovery of the one data packet by the receiver is based on the feedback, and the coding rate indicates a number of encoded packets to be generated by encoding an individual data packet.

In one configuration, the means for adjusting the coding rate is configured to increase the coding rate based on at least one of the quantity of encoded packets used for the recovery of the one data packet by the receiver being less than the number of encoded packets generated for the recovery of the one data packet or the feedback indicating the recovery of the one data packet by the receiver has successfully completed.

In one configuration, the means for adjusting the coding rate is configured to decrease the coding rate based on at least one of the quantity of encoded packets used for the recovery of the one data packet by the receiver being equal to the number of encoded packets generated for the recovery of the one data packet or the feedback indicating the recovery of the one data packet by the receiver has unsuccessfully completed.

In one configuration, the means for determining the coding rate is configured to increase, by a first step value, or decreasing, by a second step value, a number of encoded packets to be generated for recovery of each of a plurality of subpackets into which each data packet is divided.

In one configuration, the means for determining the coding rate is configured to maintain the coding rate based on feedback from the receiver.

The aforementioned means may be one or more of the aforementioned components of the apparatus 1502 configured to perform the functions recited by the aforementioned means. As described, the apparatus 1502 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The following examples are illustrative only and may be combined with aspects of other embodiments or teachings described herein, without limitation.

Example 1 is an apparatus for wireless communication at a transmitter having a memory and at least one processor coupled to the memory, and the at least one processor is configured to: determine a coding rate at which to encode data packets based on a quantity of encoded packets used by a receiver for recovery of one data packet; and transmit a set of encoded packets generated at the coding rate to the receiver.

Example 2 is the apparatus of example 1, with the at least one processor being further configured to: transmit another set of encoded packets generated at another coding rate to the receiver; and determine the quantity of encoded packets that are associated with the recovery of the one data packet based on feedback from the receiver for at least a subset of the other set of encoded packets.

Example 3 is the apparatus of example 2, and the feedback indicates the quantity of encoded packets that are associated with the recovery of the one data packet by the receiver.

Example 4 is the apparatus of example 2, and the feedback includes a set of messages indicating a respective receive status at the receiver for each of the at least the subset of the other set of encoded packets.

Example 5 is the apparatus of example 4, with the at least one processor being further configured to: receive information indicating the recovery of the one data packet by the receiver is complete, and the quantity of encoded data is determined based on the information indicating the recovery of the one data packet by the receiver is complete and a quantity of the receive statuses corresponding to a time period preceding the information indicating the recovery of the one data packet by the receiver is complete.

Example 6 is the apparatus of any of examples 1 through 5, with the at least one processor being further configured to: encode another data packet at the coding rate using at least one network coding function to generate at least a subset of the set of encoded packets, and the network coding function includes a fountain code.

Example 7 is the apparatus of any of examples 1 through 6, and the determination of the coding rate at which to encode data packets includes to: adjust the coding rate based on feedback from the receiver, and the quantity of encoded packets used for the recovery of the one data packet by the receiver is based on the feedback, and the coding rate indicates a number of encoded packets to be generated by encoding an individual data packet.

Example 8 is the apparatus of example 7, and the adjustment of the coding rate includes to: increase the coding rate based on at least one of the quantity of encoded packets used for the recovery of the one data packet by the receiver being less than the number of encoded packets generated for the recovery of the one data packet or the feedback indicating the recovery of the one data packet by the receiver has successfully completed.

Example 9 is the apparatus of example 7, and the adjustment of the coding rate includes to: decrease the coding rate based on at least one of the quantity of encoded packets used for the recovery of the one data packet by the receiver being equal to the number of encoded packets generated for the recovery of the one data packet or the feedback indicating the recovery of the one data packet by the receiver has unsuccessfully completed.

Example 10 is the apparatus of any of examples 1 through 9, and the determination of the coding rate includes to: increase, by a first step value, or decrease, by a second step value, a number of encoded packets to be generated for recovery of each of a plurality of subpackets into which each data packet is divided.

Example 11 is the apparatus of any of examples 1 through 6, and the determination of the coding rate includes to: maintain the coding rate based on feedback from the receiver.

Example 12 is an apparatus for wireless communication at a receiver having a memory and at least one processor coupled to the memory, and the at least one processor is configured to: receive, from a transmitter, encoded packets carrying a set of data packets encoded at a coding rate; transmit, to the transmitter, feedback indicating a quantity of a set of the encoded packets used for recovery of one data packet of the set of data packets; and receive, from the transmitter, other encoded packets carrying another set of data packets encoded at another coding rate.

Example 13 is the apparatus of example 12, and the feedback includes the quantity of the set of encoded packets used for the recovery of the one data packet.

Example 14 is the apparatus of example 13, with the at least one processor being further configured to: determine the quantity of the set of encoded packets used for the recovery of the one data packet.

Example 15 is the apparatus of any of examples 12 through 14, and the feedback includes a set of messages indicating a respective receive status for each of the set of the encoded packets.

Example 16 is the apparatus of any of examples 12 through 15, with the at least one processor being further configured to: decode the set of encoded packets using a network coding decoder configured for decoding a fountain code with which the set of encoded packets is encoded, and the coding rate indicates a number of encoded packets into which an individual data packet is encoded.

Example 17 is the apparatus of example 16, and the one data packet is passed from a lower layer of a protocol stack to an upper layer of the protocol stack when the decoding is successfully complete.

Example 18 is the apparatus of example 16, and the one data packet is not passed from a lower layer of a protocol stack to an upper layer of the protocol stack when the decoding is unsuccessfully complete.

Example 19 is the apparatus of example 18, and the decode is unsuccessfully complete when at least one data integrity check associated with the one data packet is failed.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication at a communications device, comprising:
    determining a coding rate at which to encode data packets based on a feedback from a receiver, where in the feedback indicates a quantity of encoded packets used by the receiver for recovery of one data packet; and
    transmitting a set of encoded packets generated at the coding rate to the receiver.

2. The method of claim 1, further comprising:
    transmitting another set of encoded packets generated at another coding rate to the receiver; and
    determining the quantity of encoded packets that are associated with the recovery of the one data packet based on the feedback from the receiver for at least a subset of the other set of encoded packets.

3. The method of claim 2, wherein the feedback comprises a set of messages indicating a respective receive status at the receiver for each of the at least the subset of the other set of encoded packets.

4. The method of claim 3, further comprising:
    receiving information indicating the recovery of the one data packet by the receiver is complete, wherein
    the quantity of encoded data is determined based on the information indicating the recovery of the one data packet by the receiver is complete and a quantity of the receive statuses corresponding to a time period preceding the information indicating the recovery of the one data packet by the receiver is complete.

5. The method of claim 1, further comprising:
    encoding another data packet at the coding rate using at least one network coding function to generate at least a subset of the set of encoded packets, wherein
    the network coding function comprises a fountain code.

6. The method of claim 1, wherein the determining the coding rate at which to encode data packets comprises:
    adjusting the coding rate based on feedback from the receiver, wherein
    the quantity of encoded packets used for the recovery of the one data packet by the receiver is based on the feedback, and
    the coding rate indicates a number of encoded packets to be generated by encoding an individual data packet.

7. The method of claim 6, wherein the adjusting the coding rate comprises:
    increasing the coding rate based on at least one of the quantity of encoded packets used for the recovery of the one data packet by the receiver being less than the number of encoded packets generated for the recovery of the one data packet or the feedback indicating the recovery of the one data packet by the receiver has successfully completed.

8. The method of claim 6, wherein the adjusting the coding rate comprises:
    decreasing the coding rate based on at least one of the quantity of encoded packets used for the recovery of the one data packet by the receiver being equal to the number of encoded packets generated for the recovery of the one data packet or the feedback indicating the recovery of the one data packet by the receiver has unsuccessfully completed.

9. The method of claim 1, wherein the determining the coding rate comprises:
increasing, by a first step value, or decreasing, by a second step value, a number of encoded packets to be generated for recovery of each of a plurality of subpackets into which each data packet is divided.

10. The method of claim 1, wherein the determining the coding rate comprises:
maintaining the coding rate based on feedback from the receiver.

11. A method of wireless communication at a communications device, comprising:
receiving, from a transmitter, encoded packets carrying a set of data packets encoded at a coding rate;
transmitting, to the transmitter, feedback indicating a quantity of a set of the encoded packets used for recovery of one data packet of the set of data packets; and
receiving, from the transmitter, other encoded packets carrying another set of data packets encoded at another coding rate.

12. The method of claim 11, wherein the feedback comprises the quantity of the set of encoded packets used for the recovery of the one data packet.

13. The method of claim 12, further comprising:
determining the quantity of the set of encoded packets used for the recovery of the one data packet.

14. The method of claim 11, wherein the feedback comprises a set of messages indicating a respective receive status for each of the set of the encoded packets.

15. The method of claim 11, further comprising:
decoding the set of encoded packets using a network coding decoder configured for decoding a fountain code with which the set of encoded packets is encoded, wherein
the coding rate indicates a number of encoded packets into which an individual data packet is encoded.

16. The method of claim 15, wherein the one data packet is passed from a lower layer of a protocol stack to an upper layer of the protocol stack when the decoding is successfully complete.

17. The method of claim 15, wherein the one data packet is not passed from a lower layer of a protocol stack to an upper layer of the protocol stack when the decoding is unsuccessfully complete.

18. The method of claim 17, wherein the decoding is unsuccessfully complete when at least one data integrity check associated with the one data packet is failed.

19. An apparatus for wireless communication at a communications device, comprising:
a memory; and
at least one processor coupled to the memory and configured to:
determine a coding rate at which to encode data packets based on a quantity of encoded packets used by a receiver for recovery of one data packet; and
transmit a set of encoded packets generated at the coding rate to the receiver.

20. The apparatus of claim 19, wherein the at least one processor is further configured to:
transmit another set of encoded packets generated at another coding rate to the receiver; and
determine the quantity of encoded packets that are associated with the recovery of the one data packet based on feedback from the receiver for at least a subset of the other set of encoded packets.

21. The apparatus of claim 20, wherein the feedback indicates the quantity of encoded packets that are associated with the recovery of the one data packet by the receiver.

22. The apparatus of claim 20, wherein the feedback comprises a set of messages indicating a respective receive status at the receiver for each of the at least the subset of the other set of encoded packets.

23. The apparatus of claim 22, wherein the at least one processor is further configured to:
receive information indicating the recovery of the one data packet by the receiver is complete, wherein
the quantity of encoded data is determined based on the information indicating the recovery of the one data packet by the receiver is complete and a quantity of the receive statuses corresponding to a time period preceding the information indicating the recovery of the one data packet by the receiver is complete.

24. The apparatus of claim 19, wherein the at least one processor is further configured to:
encode another data packet at the coding rate using at least one network coding function to generate at least a subset of the set of encoded packets, wherein
the network coding function comprises a fountain code.

25. The apparatus of claim 19, wherein the determination of the coding rate at which to encode data packets comprises to:
adjust the coding rate based on feedback from the receiver, wherein
the quantity of encoded packets used for the recovery of the one data packet by the receiver is based on the feedback, and
the coding rate indicates a number of encoded packets to be generated by encoding an individual data packet.

26. The apparatus of claim 19, wherein the determination of the coding rate at which to encode data packets comprises to:
increase, by a first step value, or decrease, by a second step value, a number of encoded packets to be generated for recovery of each of a plurality of subpackets into which each data packet is divided.

27. An apparatus for wireless communication, comprising:
a memory; and
at least one processor coupled to the memory and configured to:
receive, from a transmitter, encoded packets carrying a set of data packets encoded at a coding rate;
transmit, to the transmitter, feedback indicating a quantity of a set of the encoded packets used for recovery of one data packet of the set of data packets; and
receive, from the transmitter, other encoded packets carrying another set of data packets encoded at another coding rate.

28. The apparatus of claim 27, wherein the at least one processor is further configured to:
determine the quantity of the set of encoded packets used for the recovery of the one data packet.

29. The apparatus of claim 27, wherein the at least one processor is further configured to:
decode the set of encoded packets using a network coding decoder configured for decoding a fountain code with which the set of encoded packets is encoded, wherein the coding rate indicates a number of encoded packets into which an individual data packet is encoded.

\* \* \* \* \*